United States Patent
Watanabe

(10) Patent No.: US 7,289,054 B1
(45) Date of Patent: Oct. 30, 2007

(54) PARALLEL OVERSAMPLING ALGORITHMIC A/D CONVERTER AND METHOD OF USING THE SAME

(75) Inventor: Hikaru Watanabe, Nagoya (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 11/451,505

(22) Filed: Jun. 13, 2006

(51) Int. Cl.
*H03M 1/12* (2006.01)
(52) U.S. Cl. .................................. 341/156; 341/143
(58) Field of Classification Search ............ 341/143, 341/144, 155, 156
See application file for complete search history.

(56) References Cited

U.S. PATENT DOCUMENTS

| | | | | |
|---|---|---|---|---|
| 4,884,206 A | * | 11/1989 | Mate ........................ | 701/111 |
| 5,844,514 A | * | 12/1998 | Ringh et al. ............... | 341/143 |
| 5,936,562 A | * | 8/1999 | Brooks et al. .............. | 341/143 |
| 5,936,564 A | * | 8/1999 | Jun .......................... | 341/144 |
| 5,982,313 A | * | 11/1999 | Brooks et al. .............. | 341/143 |
| 6,243,034 B1 | * | 6/2001 | Regier ...................... | 341/166 |
| 6,424,279 B1 | * | 7/2002 | Kim et al. ................. | 341/143 |
| 6,683,550 B2 | * | 1/2004 | Al-Awadhi ................. | 341/143 |
| 7,084,797 B2 | * | 8/2006 | Yokoyama et al. ......... | 341/143 |
| 7,129,866 B2 | * | 10/2006 | Bjornsen .................... | 341/118 |
| 7,139,318 B2 | * | 11/2006 | De Lameillieure ..... | 375/240.25 |
| 7,193,544 B1 | * | 3/2007 | Fitelson et al. ............. | 341/143 |

FOREIGN PATENT DOCUMENTS

| | | |
|---|---|---|
| JP | 06-209266 | 7/1994 |
| JP | 09-289451 | 11/1997 |
| JP | 11-330965 | 11/1999 |
| JP | 2003-124813 | 4/2003 |
| JP | 2003-163596 | 6/2003 |

OTHER PUBLICATIONS

Christer Jansson: A High-Resolution, Compact, and Low-Power ADC Suitable for Array Implementation in Standard CMOS, IEEE (1995), vol. 42, No. 11, Nov. 1995.

* cited by examiner

*Primary Examiner*—Peguy JeanPierre
(74) *Attorney, Agent, or Firm*—Kenyon & Kenyon LLP

(57) ABSTRACT

Each of plural sigma-delta modulators having a sampling capacitor, an integrator, and a quantizer are connected to each other in parallel. Each of the sigma-delta modulators conducts parallel oversampling in which an analog input signal is sampled by a sampling capacitor, and the sampling result is quantized by the integrator and the quantizer. Then, the quantized values of the sigma-delta modulators are added to obtain MSBs, the residue values of the integrators after quantizing in the respective sigma-delta modulators are added, and the addition result of the residue values is converted analog-to-digital to obtain LSBs.

30 Claims, 27 Drawing Sheets

Vin=0.499*Vref

Vin=0.501*Vref

PARALLEL OVERSAMPLING ALGORITHMIC A/D CONVERTER AND METHOD OF USING THE SAME

BACKGROUND OF THE INVENTION

1. Field of the Invention

The present invention relates to an Analog-to-Digital (A/D) converter configured as a semiconductor integrated circuit, and a method for the A/D converter. More particularly, the present invention relates to a parallel oversampling algorithmic A/D converter and a method therefore. For example, the present invention is preferable to an A/D converter and a method therefore with a middle-to-high precision (12 to 16 bits) and a middle-to-high speed (100 k to 10 MHz) which is equipped in an in-vehicle sensor or a control microcomputer.

2. Description of Related Art

Up to now, an algorithmic A/D converter for a middle precision and middle speed has been employed. The algorithmic A/D converter is also called "cyclic ADC type". Simply stated, an analog input signal is repeatedly subjected to comparison by a comparator and multiply-by-two operation, to thereby generate digital data in the order from MSB. The multiply-by-two operation is generally conducted by signal arithmetic operation by a switched capacitor using an operational amplifier in CMOS, capacitors, and analog switches.

The algorithmic A/D converter is composed of a switched capacitor arithmetic operation circuit having one operational amplifier or two amplifiers, several comparators, and a control logic. Since the algorithmic A/D converter can be realized with a relatively small chip area, the apparatus is advantageous in the costs. The conventional example of the A/D converter of this type is disclosed in, for example, JP-A 124813/2003.

However, the above-mentioned conventional algorithmic A/D converter suffers from the following problems. That is, the processing speed lowers as the precision is heightened. The causes are stated below.

First, a sampling capacitor large in capacitance is required. The average thermal noise power (which dimension is $V^2$) is expressed by the $Vn^2$ in the following.

$$Vn^2 = k*T/Cs$$

where k is a Boltzmann constant, T is an absolute temperature, and Cs is a capacitor capacitance. This is also called "kT/C noise (kT on C noise or kT over C noise)". In fact, the noise of the operational amplifier is added to the capacitor noise.

As described above, the average thermal noise power is inversely proportional to the capacitor capacitance. For that reason, in order to increase the S/N ratio while suppressing the noise, the sampling capacitance must be increased. In order to obtain a precision of 14 bits, a relatively large capacitance of about 4 to 8 pF is required although depending on a range of an input voltage or the noise level of the operational amplifier. That the sampling capacitor is large means that the operating speed cannot be ensured unless the driving performance of the operational amplifier is increased in proportion to the capacitor capacitance. For that reason, the sizes of the respective elements that configure the operational amplifier and a bias current must be increased with the results that the chip area becomes large and a current consumption becomes excessive.

Also, the input sampling capacitor repeats charging and discharging operations. For that reason, kickback noise is generated at the time of switching. The magnitude of the kickback noise gets large in proportion to the capacitor capacitance. This fact means that driving impedance at a fore part of the A/D converter is large, and an influence of the kickback noise on the circuit is large, and an error is large. This will be a problem particularly in the high-precision A/D converter. On the other hand, in order to reduce the impedance of a signal source, an additional amplifier must be added, which is disadvantageous in the circuit costs and the power consumption.

Second, there arises a problem on the matching precision in the capacitor capacitance within a semiconductor integrated circuit. In general, the matching precision is about 10 to 12 bits. This is because the capacitance of the respective capacitors within the same chip is slightly uneven due to the manufacturing variation. For that reason, in order to obtain the precision of 14 bits or higher, a capacitance ratio independent algorithm is required. The algorithm of that type is complicated and large in the number of arithmetic operation steps, and long in conversion time. This problem can be eliminated by trimming the capacitor, but the trimming causes an increase in the costs.

Third, a high-gain operational amplifier is required. The gain necessary to obtain a precision of about 14 to 16 bits reaches about 20,000 to 80,000 which are high. Moreover, a wide output range and a high operating speed are required in addition to the high gain. However, an actual problem resides in that it is difficult to design the operational amplifier that is too high in the gain, wide in the output range, and high in the operating speed. This difficulty is especially serious in the case where a supply voltage is low and in the deep sub-micron process.

For example, in the case of a single-stage operational amplifier in a 0.35 µm CMOS process, a supply voltage of 3 V, and a single cascode single gain booster, when transistors are designed with the minimum channel length, the gain is only 10,000 to 20,000, which are short with respect to the required gain. When the channel lengths of the respective transistors are made longer, the gain can be increased. However, this leads to disadvantages such as an increase in the chip area and a degradation in a response speed. Under the circumstances, normally, in the case of obtaining the gain of that level, a circuit configuration with a two-stage operational amplifier is used, or an additional gain booster is equipped. It is needless to say that this structure is disadvantageous in the costs.

On the other hand, as the high-precision A/D converter architecture, there is a sigma-delta (hereinafter referred to as "ΣΔ") modulation type. The ΣΔ modulator can be structured with several switched capacitor integrators with the operational amplifier. In addition, the ΣΔ modulator has such advantages that the characteristic does not depend on a variation in the capacitor, and the output is either 0 or 1, and basically linear. The ΣΔ modulator is used for a high-precision (enabling 16 bits or more) A/D converter.

However, the ΣΔ modulator requires about several tens to several hundreds as the oversampling ratio, and does not suit the high speed processing. Also, the ΣΔ modulator requires a digital decimation filter at a post stage, which is normally a large-scale logic circuit. Because the fine CMOS cannot be used, for example, in an in-vehicle 5 V power integrated circuit, the chip area of the large-scale logic circuit becomes remarkably large. Even though the processing of the digital decimation filter can be realized by a microcomputer, a load of the microcomputer is significantly large in order to obtain the necessary processing speed, so the realization of such microcomputer is not easy.

Also, there is proposed an A/D converter that samples an input signal plural times by using a single ΣΔ modulator, which is called "extended counting ADC". In other words, the higher-bit value is determined by a digital counter, and thereafter a lower-bit value is determined by using a successive approximation A/D converter, to thereby obtain a final digital value by summing those values. This is disclosed, for example, in D. Seitzer, G. Pretzl, N. A. Hamdy, "Electronic Analog-to-Digital Converters", New York, John Wiley & Sons, 1984, chapter 3. There is disclosed the combination of the ΣΔ modulator with the successive approximation A/D converter in Christer Jansson, "A High Resolution, Compact, and Low-Power ADC Suitable for Array Implementation in Standard CMOS," IEEE Transactions on Circuits and Systems-I, vol. 42, pp. 904-912, November 1995.

The ΣΔ modulator can obtain the precision as high as the number of sampling by conducting sampling by plural times when the gain of the operational amplifier is sufficiently high from the linear characteristic that does not depend on the capacitor variation. Also, because the thermal noise is random, S/N or Signal to Noise ratio is improved by the average filter effect of a plural number of sampling. For that reason, the sizes of the structural elements such as the sampling capacitor and the operational amplifier for driving the sampling capacitor may be small. In addition, since the extended counting ADC does not require a large scale digital decimation filter, it is enough with a small-scale digital circuit. From those advantages, the ΣΔ modulator is suitable for downsizing and middle-to-high precision.

However, in fact, the modulator that is high in the conversion speed and the response input frequency could not be realized. The modulator that has been realized up to now can perform only 1 M Samples/s or less. The reasons are stated below.

First, both of the high precision and the high speed cannot be performed at the same time. The high S/N ratio is required for high precision, and for that reason, it is necessary to reduce the thermal noise which is a main component of the noise. As its countermeasures, there can be mentioned two ways that the oversampling ratio is increased and the sampling capacitor is enlarged.

However, when the oversampling ratio is increased, the conversion speed is lowered. This is because the large number of times of sampling is required. Also, the large number of times of sampling serves as a filter that averages a change in the input signals during sampling. For that reason, the high frequency component of the input signal is attenuated. In order to cope with the high frequency signal, the sampling period of time must be reduced. However, this conflicts with increasing the number of times of sampling. For that reason, both of the high precision and the high speed cannot be performed at the same time.

On the other hand, when the sampling capacitor is enlarged, the driving performance of the operational amplifier for driving the sampling capacitor must be also increased. To achieve this, the sizes of the structural elements must be increased, and the power consumption becomes high. This conflicts with the requirements of the high speed and the small chip area. Also, the kickback noise at the time of turning on/off the capacitor cannot be ignored.

A second reason is that a high-gain operational amplifier is required for the high precision. Notwithstanding, this prevents both of the high speed and the high precision from being performed at the same time. This is because an error in the operational amplifier finite gain of the first-order ΣΔ modulator is in proportion to an output voltage divided by the gain. The error is called "integrator leakage", and in order to reduce the error, it is necessary to suppress the output amplitude and increase the gain of the operational amplifier. In order to obtain the precision of 14 to 16 bits, the gain of 20,000 to 80,000 or higher is required. However, as described above, it is difficult to design the operational amplifier that is high in the gain and wide in the output range. In particular, in the case where the supply voltage is low and the fine CMOS process is used, the sufficient gain cannot be obtained by provision of only the single-stage operational amplifier and the gain booster. For that reason, it is necessary to provide an additional gain booster or two-stage operational amplifiers. In any case, it is difficult to prevent the chip area or the power consumption from increasing.

SUMMARY OF THE INVENTION

The present invention has been made to solve the problems with the above-described conventional A/D converter and the method therefore. That is, an object of the present invention is to provide an A/D converter of a new system which performs both of a high precision and a high speed at the same time and is low in the costs, and a method of conducting the A/D conversion.

To achieve the above purpose, there is provided an A/D converter, comprising: a plurality of sigma-delta modulators which are connected to each other in parallel, and each of which has a sampling capacitor, an integrator, and a quantizer; and a control unit that controls the plurality of sigma-delta modulators; wherein the control unit comprises: a parallel oversampling control unit that makes each of the sigma-delta modulators conduct sampling of an analog input signal by the sampling capacitor, and quantize a sampling result by the integrator and the quantizer; an MSBs calculating unit that adds quantized values in the respective sigma-delta modulators to obtain the MSBs; a residue adding unit that adds residue values of the integrators after quantization in the respective sigma-delta modulators; and an LSBs calculating unit that converts the addition result of the residue adding unit into a digital value to obtain LSBs.

According to another aspect of the present invention, there is provided an A/D conversion method using a plurality of sigma-delta modulators which are connected to each other in parallel, and each of which has a sampling capacitor, an integrator, and a quantizer, the method comprising: a parallel oversampling process of making each of the sigma-delta modulators conduct sampling of an analog input signal by the sampling capacitor and quantize a sampling result by the integrator and the quantizer; an MSBs calculating process to obtain MSBs by adding quantized values in the parallel oversampling process in the respective sigma-delta modulators; a residue adding process of adding residue values of the integrators in the respective sigma-delta modulators after the parallel oversampling process; and an LSBs calculating process of digitally converting the addition result of the residual adding process to obtain LSBs.

That is, in the present invention, the parallel oversampling of the analog input signal is conducted by the plural sigma-delta modulators. Then, the quantized values in the respective sigma-delta modulators are added together to obtain MSBs. In addition, the residue values of the integrators after quantization are added together, and its result is subjected to digital conversion to thereby obtain LSBs. The composition of the MSBs and the LSBs, which is obtained as described above, is a digital conversion value of the analog input signal. Both of the parallel oversampling and the addition of the residue values are ratio independent operations. For that reason, an accurate value that is not affected by the matching error (ratio precision) of the capacitor is obtained. Also, since the input signal can be simply processed, a parasitic capacitance at an input side can be reduced. For that reason, the present invention is capable of conducting arithmetic operation without degrading the linearity of the sigma-delta modulator and suits the arithmetic operation with high speed and high precision.

According to the present invention, there are provided the A/D converter of the new system which performs both of the high precision and the high speed at the same time and is low in the costs, and a method therefore. These and other objects and many of the attendant advantages of the invention will be readily appreciated as the same becomes better understood by reference to the following detailed description when considered in connection with the accompanying drawings.

BRIEF DESCRIPTION OF THE DRAWINGS

These and other objects and advantages of this invention will become more fully apparent from the following detailed description taken with the accompanying drawings in which.

DETAILED DESCRIPTION OF THE PREFERRED EMBODIMENTS

Figure 1:
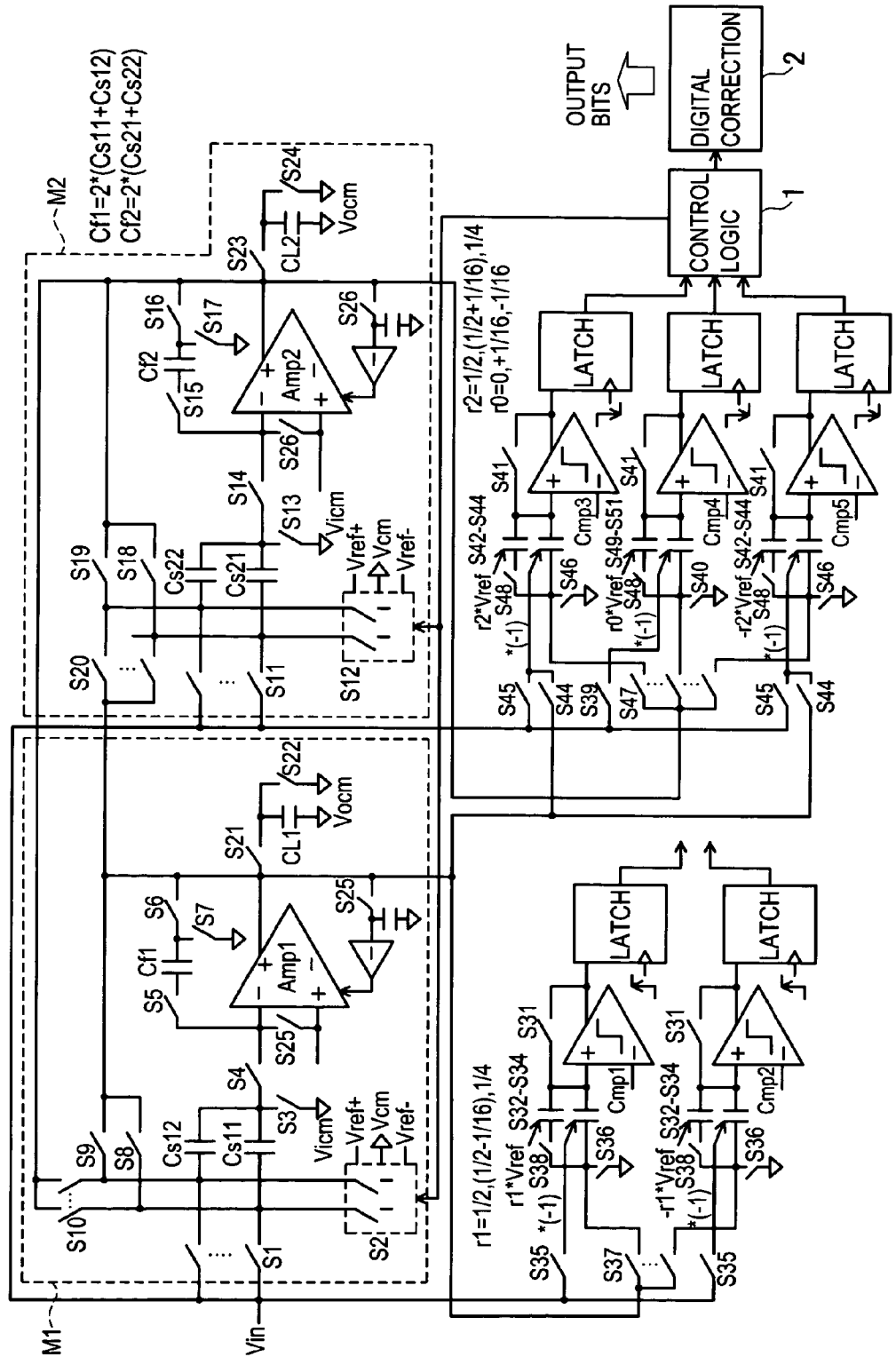
FIG. 1 is a circuit diagram showing an A/D converter according to an embodiment of the present invention.

Now, a description will be given of preferred embodiments of the present invention with reference to the accompanying drawings. A circuit diagram of an A/D converter according to this embodiment is shown in FIG. 1. In the circuit diagram, one group centered on an operational amplifier Amp1 is the first ΣΔ modulator M1, and one group centered on an operational amplifier Amp2 is the second ΣΔ modulator M2. In the case of fully differential type, this circuit diagram shows only one side of the real circuit for simplicity. An analog input signal Vin is input into both of those ΣΔ modulators. In each of those ΣΔ modulators, an integrator is made up of an amplifier and capacitors which are arranged in parallel (Amp1 and Cf1, Amp2 and Cf2). A group centered on a comparator and a latch at a lower side of FIG. 1 is an operation section.

The ΣΔ modulators will be described in more detail. In the ΣΔ modulator M1, two capacitors Cs11 and Cs12 (hereinafter referred to as "sampling capacitors") are disposed in parallel upstream of an integrator (Amp1 and Cf1). In this example, the capacitance of the respective capacitors satisfies the following expression. Symbols in the expression represent the capacitance of the respective capacitors.

$$Cf1=2\times(Cs11+Cs12)$$

That is, the capacitor Cf1 (hereinafter referred to as "integration capacitor") has the double capacitance of the total capacitance of the sampling capacitors Cs11 and Cs12. A switch S4 for connection and disconnection is disposed between the sampling capacitors Cs11, Cs12 and the integrator. A switch S3 for setting the potential to a common-mode level is connected to the sampling capacitors Cs11 and Cs12 at the opposite side of the input signal Vin.

A switch S1 is disposed between the sampling capacitors Cs11, Cs12 and the input signal terminal Vin. Also, a switch S2 that sets a voltage level to any one of a reference voltage Vref+, a common-mode level, and a reference voltage Vref− is disposed at the input signal Vin side of the sampling capacitors Cs11 and Cs12. Also, switches S8 to S10 are disposed at the input signal Vin side of the sampling capacitors Cs11 and Cs12 in addition to the above switch. The switches S8 and S9 are connected to an output side of the integrator. The switch S10 is connected to an output side of an integrator in the ΣΔ modulator M2.

Switches S5 and S6 for connection and disconnection are disposed at both sides of the integration capacitor Cf1. A switch S7 for setting the potential to the common-mode level is further disposed at one side of the integration capacitor Cf1 with the switch S6. The ΣΔ modulator M2 is configured as with the ΣΔ modulator M1. All of those switches are operated by a control logic 1.

Capacitors CL1, CL2, and switches S21 to S24 in the circuit of FIG. 1 are added for frequency compensation and also for suppressing the thermal noise. Also, switches S25, S26, and auxiliary amplifiers disposed between those switches S25, S26 and the operational amplifiers Amp1, Amp2, respectively, are added for offset cancellation. However, those elements are not essential in the A/D converter according to this embodiment.

A comparator group, a control logic 1, and a digital correction section 2 are disposed in an arithmetic operation section of the lower half portion in FIG. 1. The respective comparators Cmp1 to Cmp5 of the comparator group output H/L signals with respect to the outputs of the operational amplifiers Amp1 and Amp2. Capacitors and switches that are connected at the input sides of those capacitors are provided for changing the threshold values of the comparators. Those elements function as parts of the ΣΔ modulators. Also, those elements are also parts of a Nyquist rate A/D converter 3 shown in FIG. 2. The control logic 1 conducts operation on the basis of the outputs of the respective comparators. Also, the control logic 1 controls the respective switches within the ΣΔ modulators M1 and M2 on the basis of the above operation results. Other details within the circuit will be described below.

Figure 2:
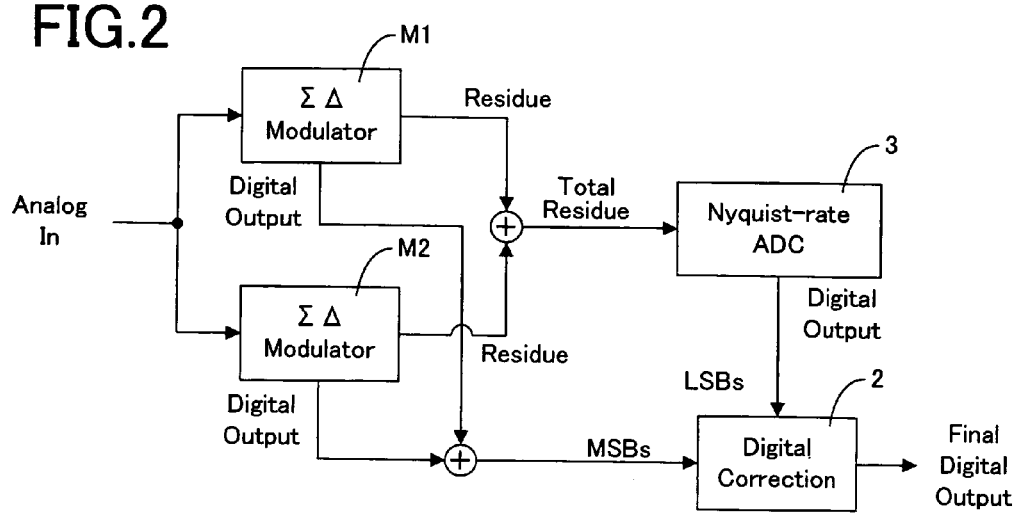
FIG. 2 is a block diagram showing the operation principle of the A/D converter according to the embodiment.

The basic operation principle of the A/D converter according to this embodiment will be described with reference to a block diagram of FIG. 2. In the A/D converter according to this embodiment, the input signal Vin is input to the ΣΔ modulators M1 and M2 in parallel. Then, a total of the digital outputs from the ΣΔ modulators M1 and M2 becomes MSBs. Also, the residues of the ΣΔ modulators M1 and M2, that is, a total of the integration values after sampling operation is converted into a digital value by the Nyquist rate A/D converter 3. This digital value becomes LSBs. Then, the MSBs and the LSBs are combined together by the digital correction section 2 to obtain a final digital value.

Figure 3:
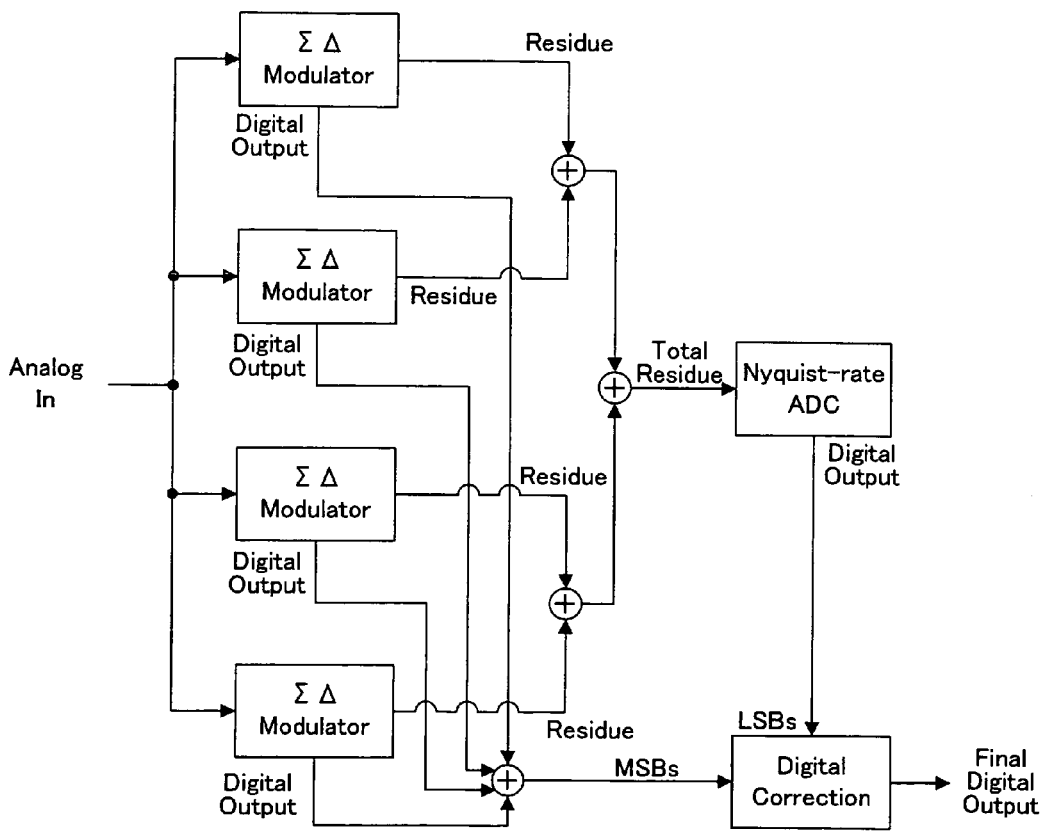
FIG. 3 is a block diagram showing the operation principle of the A/D converter according to the embodiment.

As shown in FIG. 3, it is possible that the A/D converter is configured by four ΣΔ converters. In this case, there are provided four ΣΔ converters in the circuit diagram. In the following description of this embodiment, the number of ΣΔ converters is 2 so far there is no specific description.

In the A/D converter according to this embodiment, the above operation is realized by repeating a succeeding cycle through the circuit of FIG. 1.

(1) Reset

First in conversion, the ΣΔ converters M1 and M2 are reset. As a result, the memory effect of the previous cycle is erased.

(2) Parallel oversampling

The input signals Vin are sampled by the ΣΔ converters M1 and M2 by plural times. The sampled value is quantized by the comparator, and the quantized value is the basis of the MSBs. The sampling operation is ratio-independent, which is not affected by the matching error of the capacitors. The residues remain in the integrators of the ΣΔ converters M1 and M2 after arithmetic operation, respectively.

(3) Addition of Residues

The residues that remain in the respective integrators are added to obtain the total residue. This arithmetic operation is also ratio-independent, which is not affected by the matching error of the capacitors.

(4) Determination of LSBs

The algorithmic operation is repeated from the total residue, to thereby determine the digital value of the lower-order bit. The algorithmic operation means that a value is multiplied by two, and the reference voltage value Vref is subtracted from that value according to the output of the comparator.

[Basic Operation]

Figure 4:
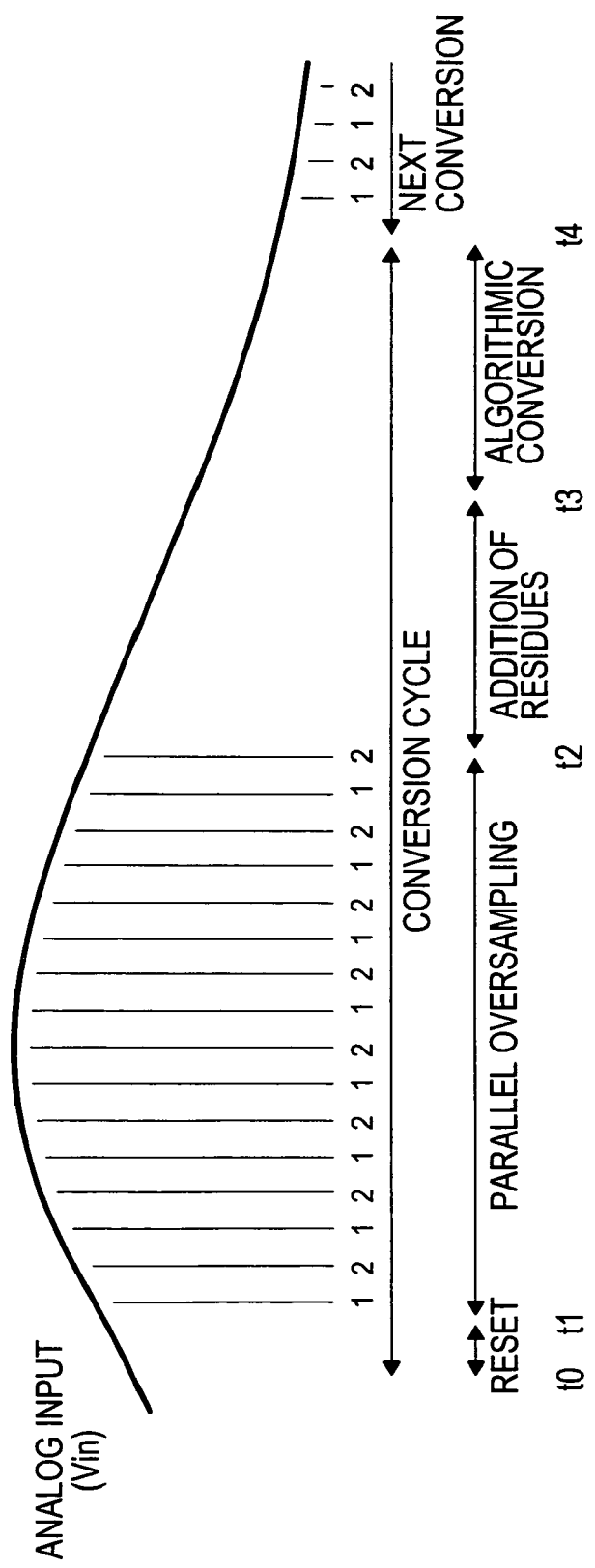
FIG. 4 is an explanatory diagram showing the operation cycle in the A/D converter according to the embodiment.

In the basic operation, the arithmetic procedure of the above cycle is conducted as shown in FIG. 4. In this example, a curve indicated by Vin in FIG. 4 expresses a change in the analog input signal Vin with time. 16 clocks that reach a time t4 from a time t0 in FIG. 4 are one cycle of the A/D conversion. The A/D converters are reset during the first clock (time t0 to time t1) among those clocks.

Then, parallel oversampling is conducted during 8 clocks from the time t1 to the time t2. The numerals "1" and "2" just above the horizontal axis indicate No. of any one of the ΣΔ modulators M1 and M2 to sample. Each of the numerals "1" and "2" is provided in one block, and those numerals are alternately arranged. That is, in an example of FIG. 4, sampling is conducted at an alternating timing by the structural example having the two ΣΔ modulators shown in FIG. 2. In this example, the ΣΔ modulators M1 and M2 alternately sample 8 times, respectively. The timing relationship of the sampling due to those two ΣΔ modulators can be the same time other than alternating. Also, the number of times of samplings is not limited to 8 times.

Sequentially, the residues are added during the time t2 to the time t3 (3.5 clocks). In addition, algorithmic operation is conducted during the time t3 to the time t4 (3.5 clocks). In this example, it is assumed that a digital value of 14 bits is obtained by the operation during 16 clocks in total from the time t0 the time t4. In addition, it is possible to obtain an output value of 16 bits by the operation of 17 clocks with addition of one clock.

Figure 5:
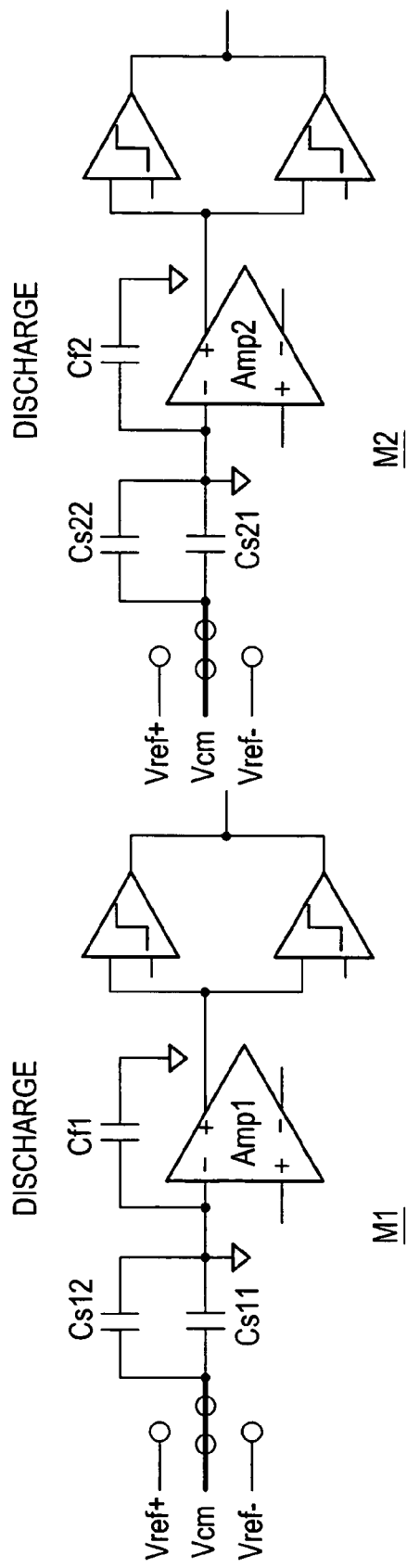
FIG. 5 is an explanatory diagram showing the reset operation in the A/D converter according to the embodiment.

The operation of the respective parts in the circuit shown in FIG. 1 will be described in the respective steps of the above cycle. FIG. 5 shows the operation at the step of reset. In the reset operation, the sampling capacitors and the integration capacitors of the ΣΔ modulators M1 and M2 are discharged. In other words, FIG. 5 shows a status in which the respective switches are set in the following states in the ΣΔ modulator M1.

Switch S1 is off.
Switch S2 is to the common-mode level.
Switches S3 to S5 are on.
Switch S6 is off.
Switch S7 is on.
Switches S8 to S10 are off.

In other words, when the switches S1 and S6 are off, the ΣΔ modulator M1 is in a state where the inherent input and output are blocked. Then, when the switch S2 is connected to the common-mode level, and the switches S3 to S5 and S7 are on, all of the sampling capacitors Cs11, Cs12 and the integration capacitor Cf1 are shorted to the output common-mode level. As a result, the sampling capacitors Cs11, Cs12 and the integration capacitor Cf1 are discharged. The ΣΔ modulator M2 is made in the same state.

Figure 6:
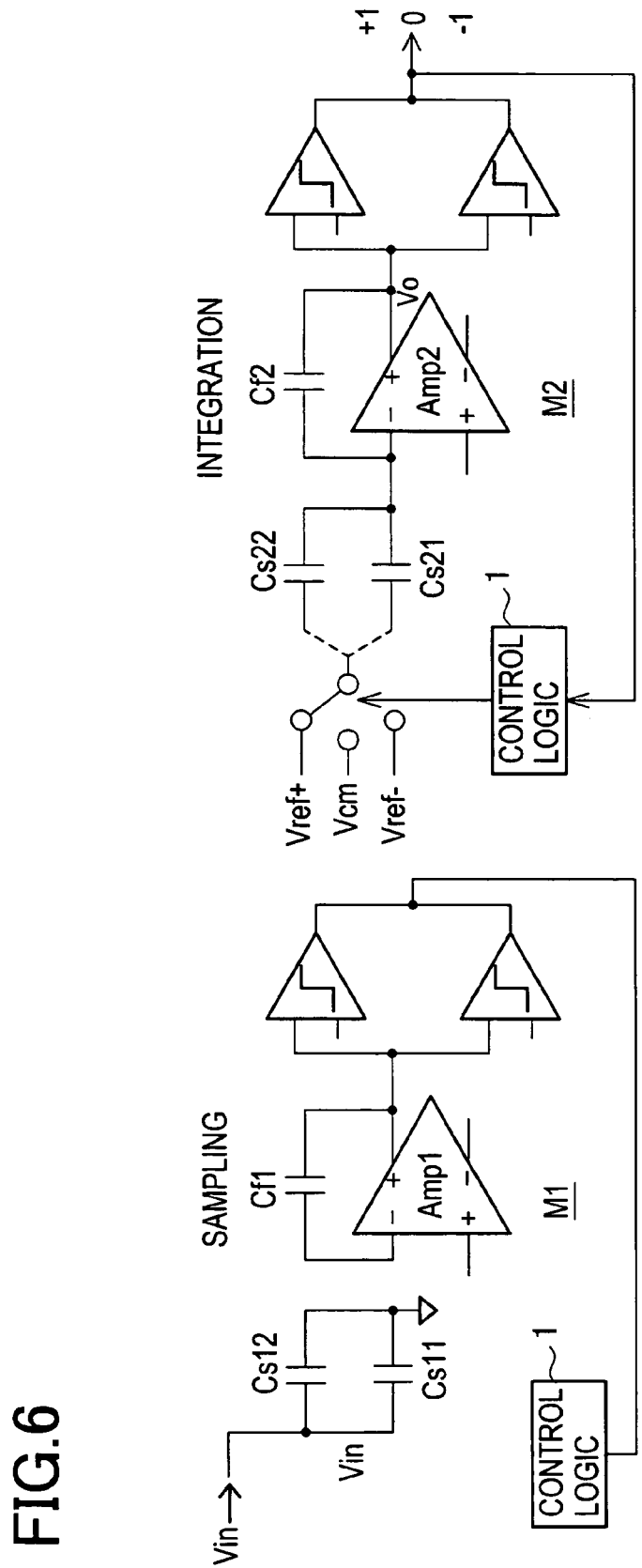
FIG. 6 is an explanatory diagram showing the sampling operation in the A/D converter according to the embodiment.
Figure 7:
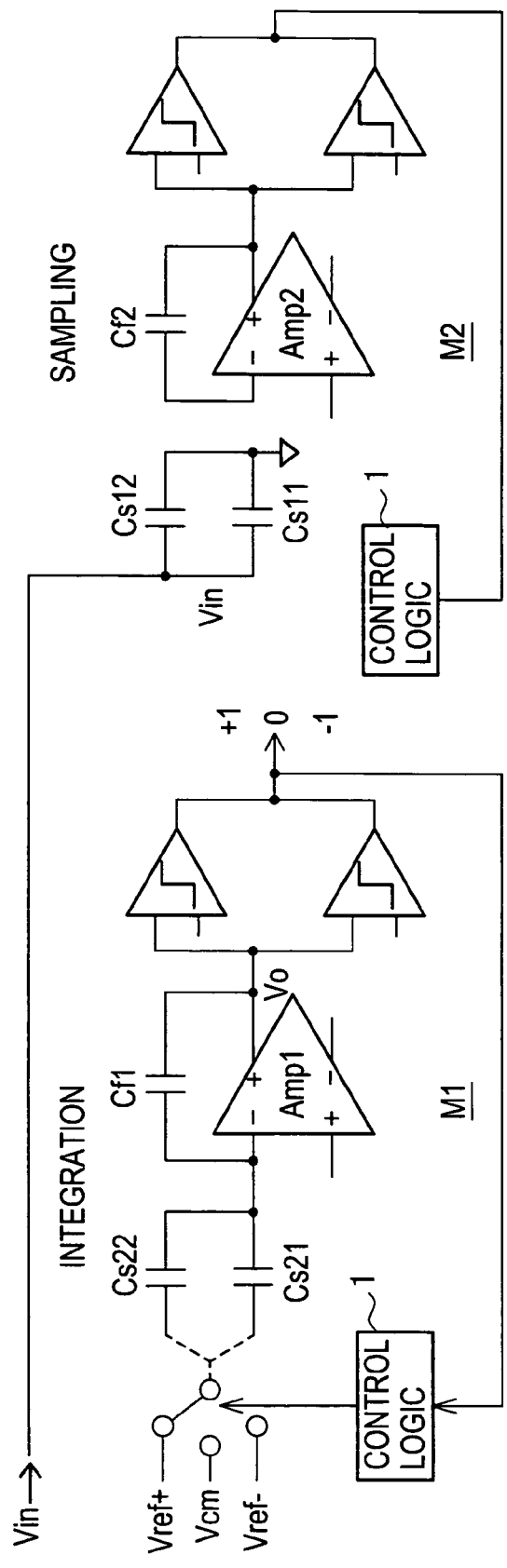
FIG. 7 is an explanatory diagram showing the sampling operation in the A/D converter according to the embodiment.

The subsequent parallel oversampling operation is executed by recurrently changing over a state shown in FIG. 6 and a state shown in FIG. 7. The state shown in FIG. 6 is a state in which the input signal Vin is taken in the sampling capacitor in the ΣΔ modulator M1, and the taken voltage values are integrated in the ΣΔ modulator M2.

In other words, in the ΣΔ modulator M1 of that state, the respective switches are in the following states.

Switch S1 is on.
Switch S2 is off.
Switch S3 is on.
Switch S4 is off.
Switches S5 and S6 are on.
Switch S7 is off.
Switches S8 to S10 are off.

As a result, the input signal Vin is taken in the sampling capacitors Cs11 and Cs12.

On the other hand, in the ΣΔ modulator M2 of that state, the respective switches are in the following states.

Switch S11 is off.
Switch S12 is repeating the switching of Vref+.
Switch S13 is off.
Switches S14 to S16 are on.
Switch S17 is off.
Switches S18 to S20 are off.

As a result, the voltages that are taken in the sampling capacitors Cs21 and Cs22 are amplified by the operational amplifier Amp2 and then outputted to a comparator in the arithmetic operation section. The comparator outputs "high" when an output voltage Vo of the operational amplifier Amp2 is positive. Therefore, the control logic 1 conducts the switching operation of the switch S12 while the output of the comparator is "high". As a result, the voltages across the sampling capacitors Cs21 and Cs22 lower by Vref+ per one operation of the switch S12. This causes the output voltage Vo of the operational amplifier Amp2 to lower. When the voltage Vo turns negative, the output of the comparator is reversed to "low".

Then, the control logic 1 stops the switching operation of the switch S12. The control logic 1 has counted the number of output of comparators during the oversampling operation. This count value is a quantized value of the voltages that were taken in the sampling capacitors Cs21 and Cs22 and is a base of the MSBs. Also, the output voltage Vo of the operational amplifier Amp2 at that time remains in the integration capacitor Cf2 as the residue.

In the state of FIG. 7, the roles of the ΣΔ modulators M1 and M2 in the state of FIG. 6 are replaced with each other. As described with reference to FIG. 4, the sampling in the state of FIG. 6 and the sampling in the state of FIG. 7 are alternately conducted 8 times respectively during 8 clocks from the time t1 to the time t2. The total of the count values by those operations is calculated by the control logic 1 to provide the MSBs. Also, the voltages that remain in the integration capacitors Cf1 and Cf2 after the sampling has been completely finished are the respective final residues.

The parallel oversampling operation is so-called ratio-independent operation. This is because even if an error exists in the capacitance of the sampling capacitor, the effect of the error is in reverse directions at the time of sampling and at the time of integration. In other words, the effect of the error is canceled. For that reason, an accurate value that is not affected by the matching error (ratio precision) of the capacitor is obtained.

Figure 8:
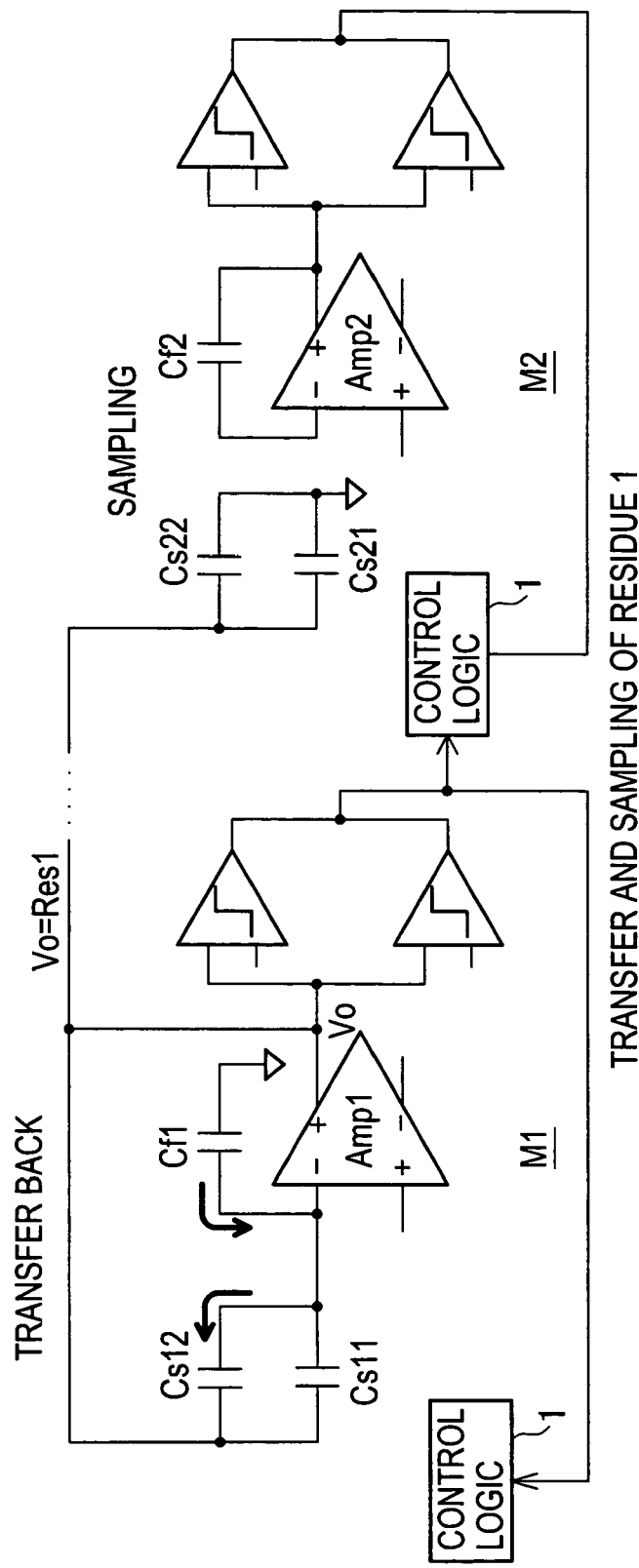
FIG. 8 is an explanatory diagram showing the adding operation of residues in the A/D converter according to the embodiment.
Figure 9:
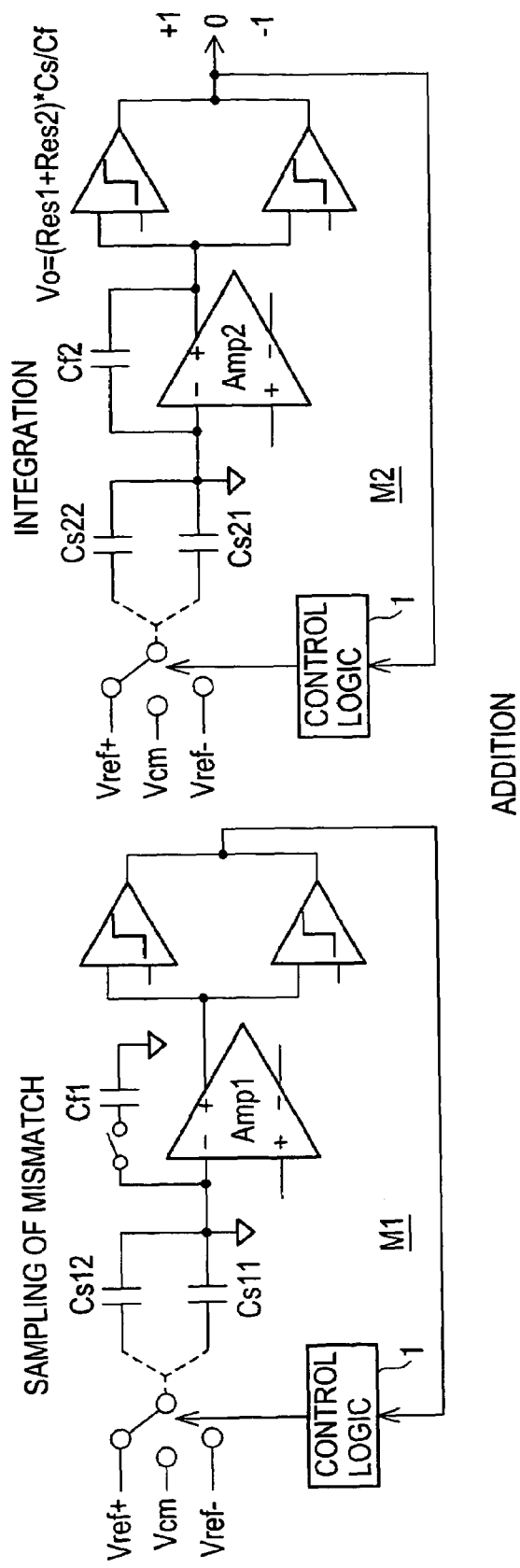
FIG. 9 is an explanatory diagram showing the adding operation of residues in the A/D converter according to the embodiment.

Subsequently to the parallel oversampling operation, the residues are added. This process is executed in a state shown in FIG. 8 and a state shown in FIG. 9. The state of FIG. 8 is a step in which the residue of the ΣΔ modulator M1 is transferred to the ΣΔ modulator M2 and taken in. The state of FIG. 9 is a adding process that is conducted after the above process.

In the ΣΔ modulator M1 of the state shown in FIG. 8, the respective switches are in the following states.

Switches S1 to S3 are off.
Switches S4 and S5 are on.
Switch S6 is off.
Switches S7 to S9 are on.
Switch S10 is off.

In the ΣΔ modulator M2, the respective switches are in the following states.

Switches S11 and S12 are off.
Switch S13 is on.
Switch S14 is off.
Switches S15 and S16 are on.
Switches S17 to S19 are off.
Switch S20 is on.

As a result, the residue voltage Res1 of the integration capacitor Cf1 appears as the output voltage Vo of the ΣΔ modulator M1 through the sampling capacitors Cs11, Cs12 and the switches S8, S9. In addition, the output voltage Vo is sampled to the sampling capacitors Cs21 and Cs22 of the ΣΔ modulator M2 through the switch S20. With this configuration, the residue of the ΣΔ modulator M1 is taken in the ΣΔ modulator M2.

In the ΣΔ modulator M2 that is in the subsequent state shown in FIG. 9, the respective switches are in the following states.

Switch S11 is off.
Switch S12 is repeating the switching of reference voltages.
Switch S13 is off.
Switches S14 to S16 are on.

Switch S17 is off.
Switches S18 to S20 are off.
In the ΣΔ modulator M1, the respective switches are in the following states.
Switch S1 is off.
Switch S2 is repeating the switching of reference voltages.
Switches S3 and S4 are on.
Switches S5 and S6 are off.
Switch S7 is on.
Switches S8 to S10 are off.

In ΣΔ modulator M2 at this state, a value resulting from multiplexing a total voltage (Res1+Res2) of the residue voltage Res2 of the integration capacitor Cf2 and the voltage Res1 taken in the sampling capacitors Cs21 and Cs22 by a capacitance ratio (Cs/Cf) of the integration capacitor and the sampling capacitor (total of two capacitors) appears as the output voltage Vo. As a result, the addition of the residues is conducted. The ΣΔ modulator M1 samples the mismatch while the ΣΔ modulator M2 adds the residues.

The addition of the residues is also the radio independent operation. For that reason, there is obtained an accurate value that is not affected by the mismatch of the capacitors. It is needless to say that the roles of the ΣΔ modulators M1 and M2 may be replaced by the description of FIGS. 8 and 9.

Figure 10:
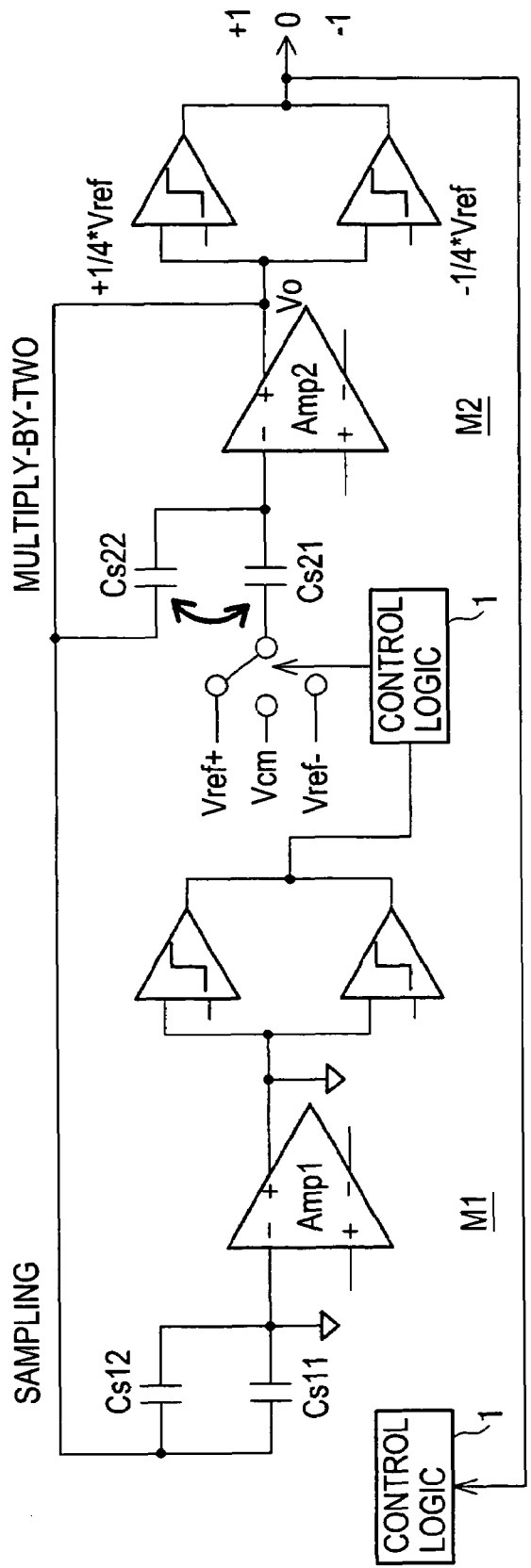
FIG. 10 is an explanatory diagram showing the algorithmic operation of residues in the A/D converter according to the embodiment.

The subsequent step is an algorithmic operation. The algorithmic operation is executed by repetitively switching over the state of FIG. 10 and the state of FIG. 11. The state of FIG. 10 is a state in which the residue at that time is multiplied by two, sampled in the capacitors Cs11 and Cs12, and compared with ±¼ Vref.

In other words, in the circuit M2 in this state, the respective switches are in the following state.
Switch S11 is off.
Switch S12 is a state indicated by Table 1 with respect to Cs21, and off with respect to Cs22.
Switch S13 is off.
Switch S14 is on.
Switches S15 to S18 are off.
Switch S19 is on.
Switch S20 is off.

The connection destination of the switch S12 with respect to the sampling capacitor Cs21 is made, for example, as follows, by the output voltage Vo of the operational amplifier Amp2.

TABLE 1

Vo < −0.25 Vref → Vref−
−0.25 Vref < Vo < 0.25 Vref → common-mode level
0.25 Vref < Vo → Vref+

On the other hand, in the circuit M1 of that state, the respective switches are in the following state.
Switches S1 and S2 are off.
Switches S3 and S4 are on.
Switches S5 to S9 are off.
Switch S10 is on.

As a result, the residue of the circuit M2 is multiplied by two, sampled in the capacitors Cs11 and Cs12, and compared with ±¼ Vref.

Figure 11:
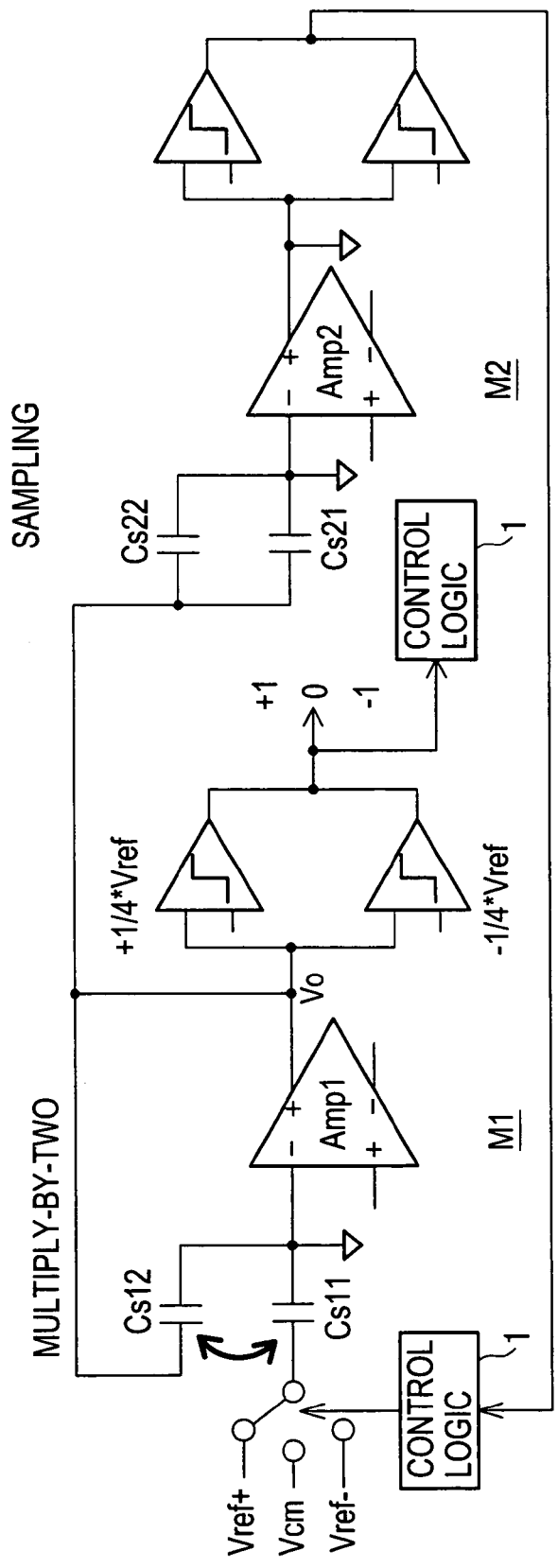
FIG. 11 is an explanatory diagram showing the algorithmic operation in the A/D converter according to the embodiment.

The sampling capacitor Cs22 of the circuit M2 in the state of FIG. 10 is used as a feedback capacitor regardless of the output voltage Vo. In the state of FIG. 11, the roles of the circuits M1 and M2 in the state of FIG. 10 are replaced with each other. Thus, the state of FIG. 10 and the state of FIG. 11 are alternately repeated by the given number of times. In other words, a pipeline process is conducted. In this example, the comparison results by the comparator in the respective stages are set to the LSBs. The number of the LSBs is the repetitive number of times of the algorithmic operation.

When the above-mentioned A/D converter is compared with another architecture, the following results are obtained. First, in the A/D converter of this embodiment, the input of the operation amplifier is simple. On the other hand, in the A/D converter of this embodiment, three input switches are enough for one operation amplifier (Switches S3 to S5 with respect to Amp1, and Switches S13 to S15 with respect to Amp2). And, a switch is added to an output side of the operational amplifier to realize a parallel arrangement (Switches S6 and S7 with respect to Amp1, and Switches S16 and S17 with respect to Amp2). The number of switches at the input side is minimized. For that reason, the parasitic capacitance of the input terminal of the operation amplifier is minimized.

As a result, an influence of the charge injection of the switch is also minimized. From this fact, it is possible to conduct adding operation without damaging the inherent linearity of the ΣΔ modulator. For that reason, this structure is suitable for high-speed and high-precision operation.

[Operation Point Dispersion of Integrator (1)]

In the A/D converter of this embodiment, further, the operation points of the integrators can be dispersed. This is profitable for cancellation of the integration leakage. For this, in one ΣΔ modulator, when the output value exceeds a given threshold value, the output of the integrator is shifted to a reverse polarity direction. Alternatively, an initial value is given to one integrator from the beginning to operate the integrator. As a result, the operation points of the integrators are intentionally dispersed in the reverse polarity direction to operate the integrators.

Figure 12:
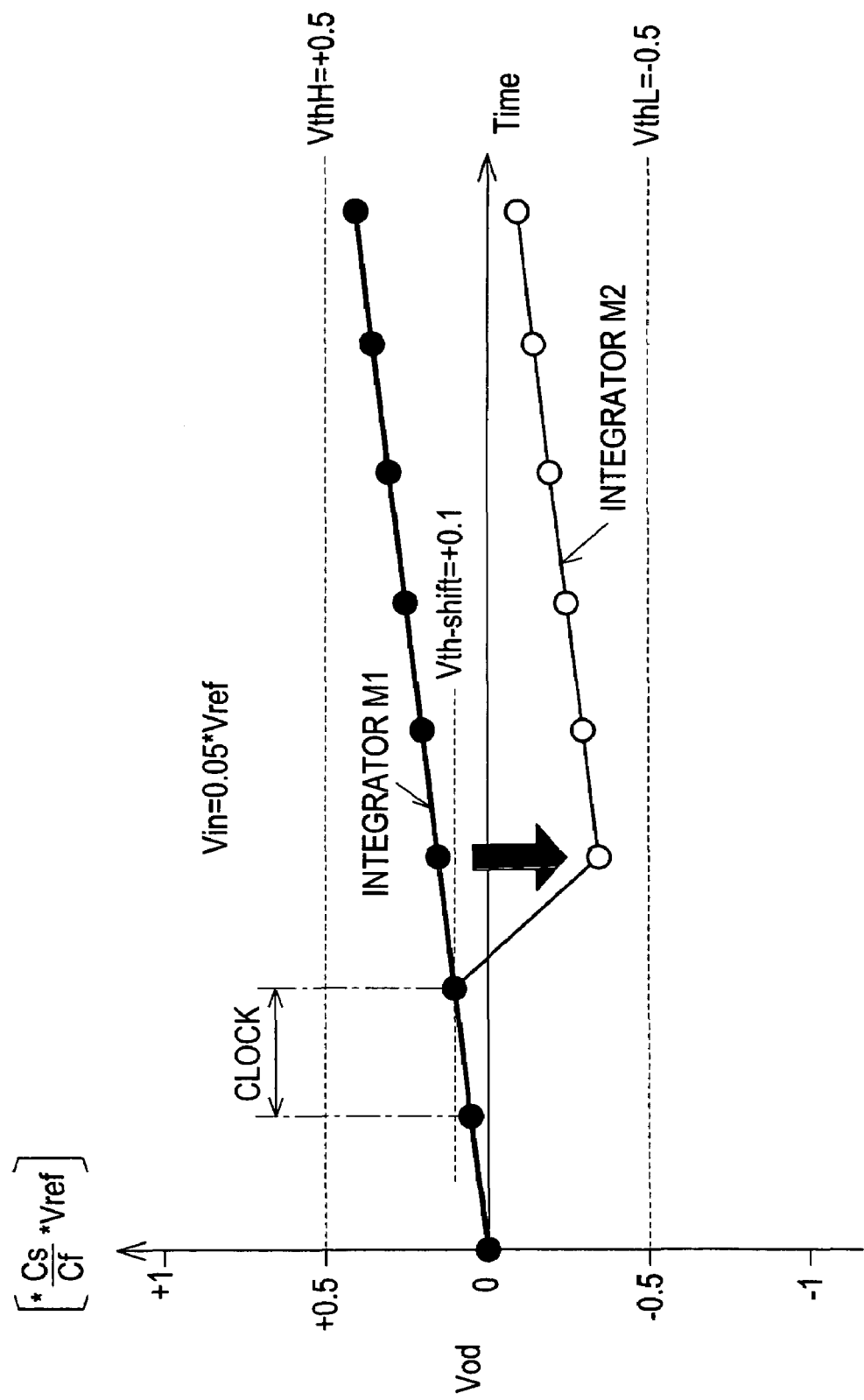
FIG. 12 is a graph for explaining the dispersion of the operation points of an integrator in the A/D converter according to the embodiment.

This status will be described with reference to a graph of FIG. 12. The graph of FIG. 12 shows a status in which the integration output values Vod in the ΣΔ modulators M1 and M2 are changed with a progress of sampling. The unit of the vertical axis is indicated by a value of the ratio with respect to {(Cs/Cf)*Vref}. In an example of FIG. 12, the initial values of those ΣΔ modulators M1 and M2 are set to be equal to each other, and when the integration output value Vod exceeds a given threshold value, only the ΣΔ modulator M2 is shifted toward the reverse polarity direction by a given value. The threshold value is 0.1 in a value of the vertical axis, and the amount of shift is 0.5 in a value of the horizontal axis.

In FIG. 12, the integration output value Vod reaches a threshold value at a second clock from the sampling start. For that reason, from the third clock, only the output value of the ΣΔ modulator M2 is shifted toward the minus direction. This shift can be realized by connecting one of the switches S12 to the voltage Vref+. As a result, in the third clock and the subsequent clocks, the integration output values of those modulators are reversed in the polarity to each other. With this operation, an influence of the integrator leakage is canceled to reduce an error. An initial value of −0.5 may be given to the ΣΔ modulator M2 from the beginning.

In this example, the fact that the integration output value Vod exceeds the threshold value can be detected by Cmp4 that is the center of three comparators in the lower right of FIG. 1. The comparator Cmp4 is capable of being set to three values as a threshold value. Namely, r0*Vref where r0=0, +1/16, −1/16. Alternatively, comparators having that value as a threshold value in advance may be arranged in parallel.

[Operation Point Dispersion of Integrator (2)]

The dispersion of the operation points of the integrators can be also realized by operating the integrators in a state where the threshold voltages of the comparators with respect to those ΣΔ modulators M1 and M2 are different from each other. In order to achieve this, for example, the threshold voltage of the comparators may be changed between the ΣΔ modulators M1 and M2. Alternatively, the comparator for the ΣΔ modulator M1 and the comparator for the ΣΔ modulator M2 may be disposed, separately.

Figure 13:
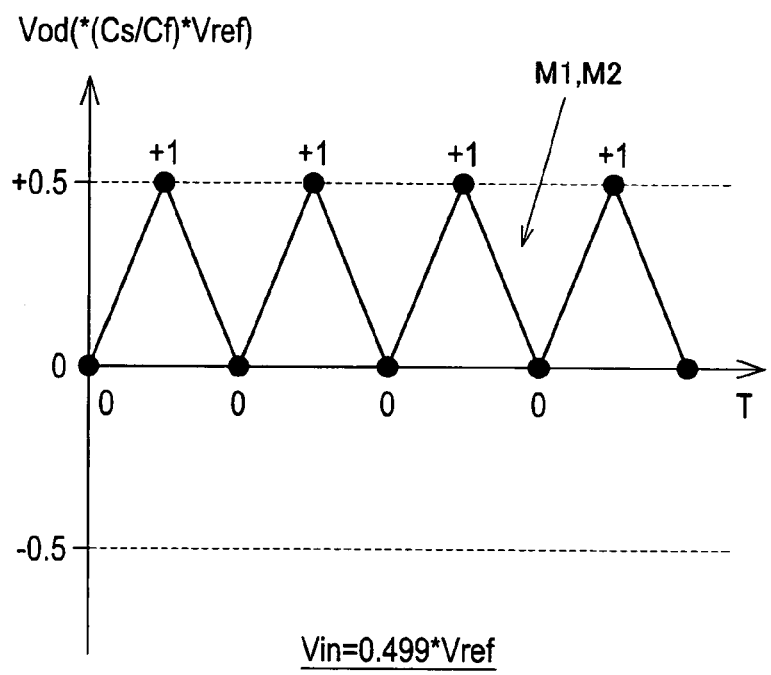
FIG. 13 is a graph for explaining a discontinuous change in the operation point of the integrator.
Figure 14:
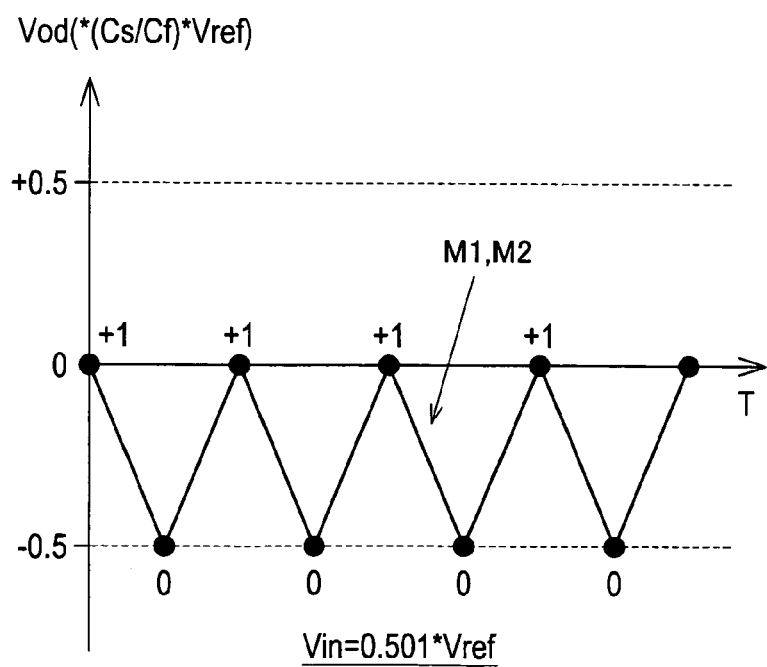
FIG. 14 is a graph for explaining a discontinuous change in the operation point of the integrator.

When the ΣΔ modulators M1 and M2 have the same threshold, there arises the following problem. That is, the operation point of the integrators is changed from positive to negative with the boundary of the threshold point, or from negative to positive in a discontinuous manner. FIGS. 13 and 14 indicate that problem in the case where the threshold voltage is "0.5*(Cs/Cf)*Vref". In other words, FIG. 13 shows a case in which the input voltage Vin is slightly lower than the threshold voltage, and FIG. 14 shows a case in which the voltage Vin is slightly higher than the threshold voltage. The state of FIG. 13 is negative in the leak, and the state of FIG. 14 is positive in the leak. When the voltage Vin is close to the threshold voltage, the above discontinuous change occurs when the operation point is shifted from the state of FIG. 13 to the state of FIG. 14, or when the operation point is shifted from the state of FIG. 14 to the state of FIG. 13.

Figure 15:
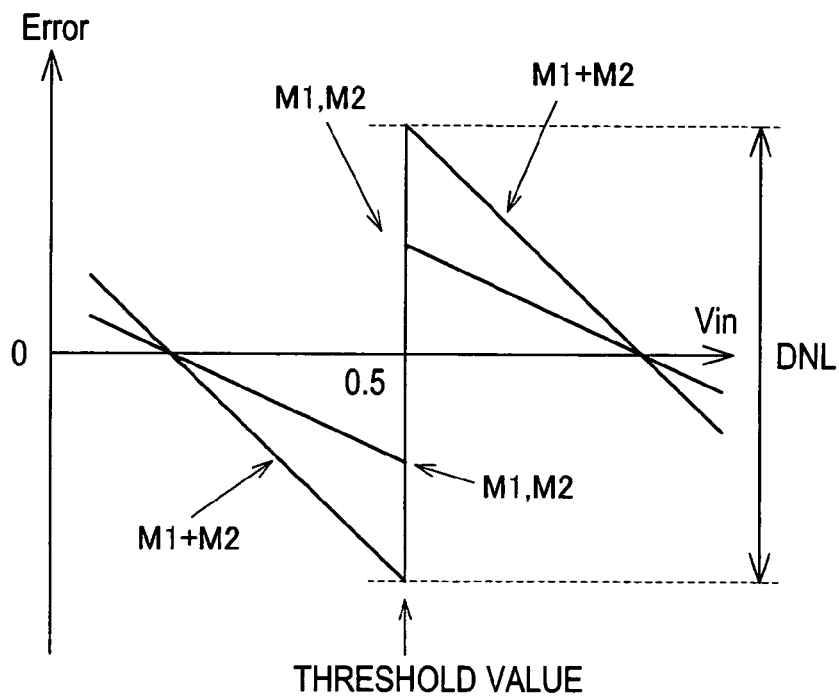
FIG. 15 is a graph for explaining a discontinuous change in the operation point of the integrator.

For that reason, the integration leakage rapidly changes between positive and negative to generate a large DNL (Differential Non-Linearity error). Moreover, the discontinuous change is generated in the ΣΔ modulators M1 and M2 at the same time. For that reason, the DNL in total is double of the DNL in each of the ΣΔ modulators M1 and M2 (FIG. 15). The DNL causes missing code or distortion of the A/D conversion and deteriorates the SNDR with the result that the DNL is not preferable. On the contrary, it is possible that both of the threshold voltages with respect to the ΣΔ modulators M1 and M2 are similarly shifted from the above value together. As a result, it is possible to delete the discontinuous change in the error. However, a range of the output voltage of the integrator becomes large, and the output INL (Integral Non-Linearity error) becomes large.

Figure 16:
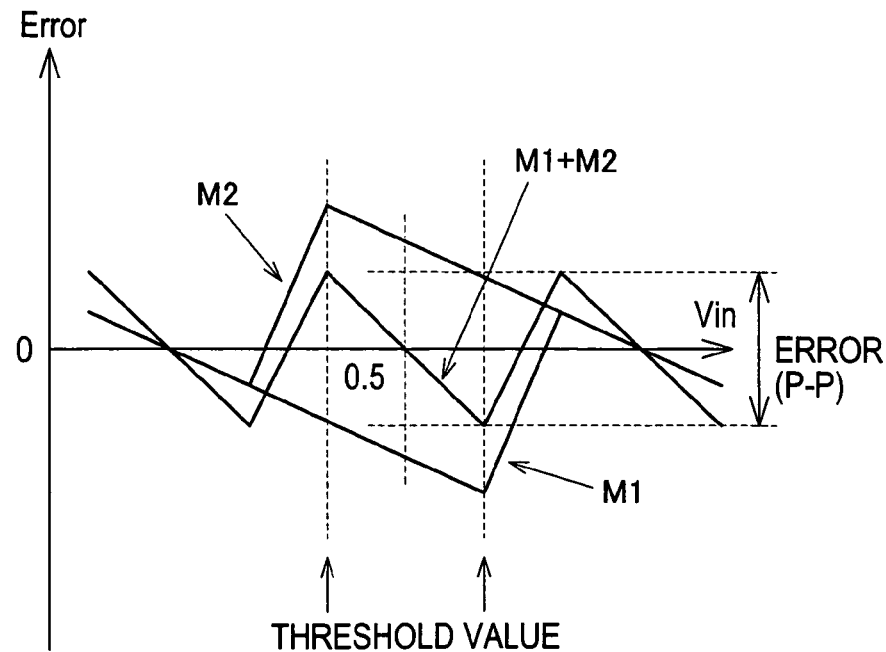
FIG. 16 is a graph for explaining the suppression effect of the change in the operation point of the integrator.
Figure 17:
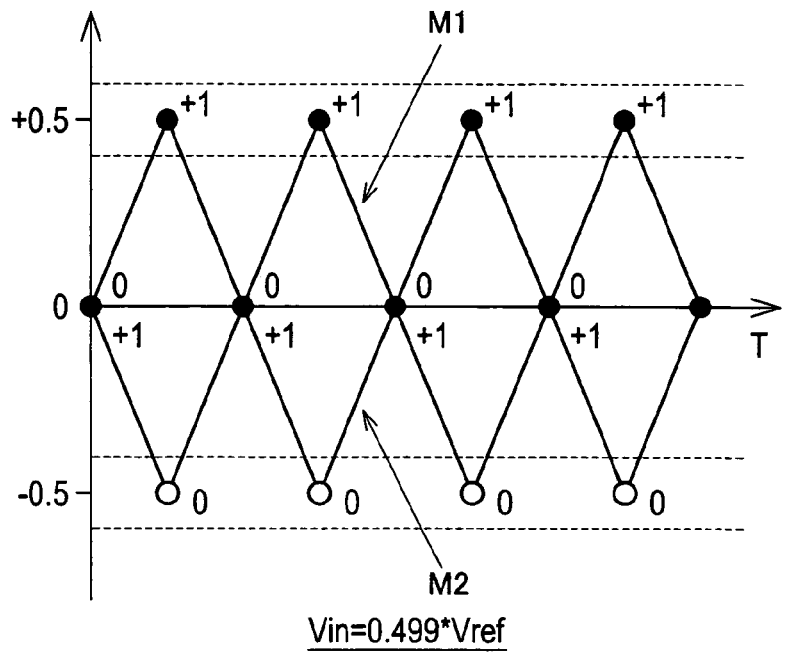
FIG. 17 is a graph for explaining the relaxation of the change in the operation point of the integrator.
Figure 18:
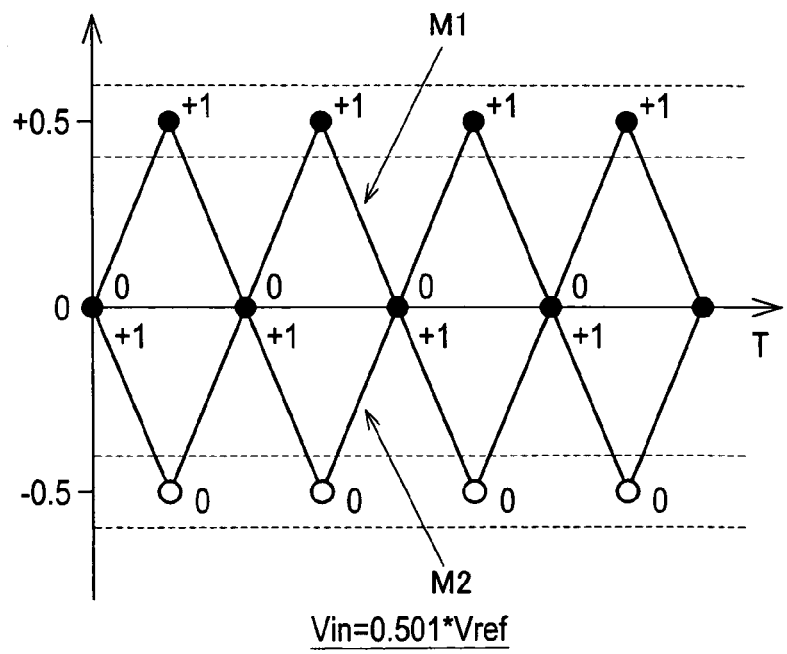
FIG. 18 a graph for explaining the relaxation of the change in the operation point of the integrator.

Under the circumstances, the threshold voltages of the comparators are intentionally shifted in reverse directions with respect to the ΣΔ modulators M1 and M2. With this measure, the operation point is divided into two as shown in FIG. 16. As a result, the error change between positive and negative is dispersed. Then, the amount of error in the respective ΣΔ modulators M1 and M2 is larger than that in the case of FIG. 15, but the DNL in total is smaller than that in the case of FIG. 15. This is because the integrator leakage of the ΣΔ modulators M1 and M2 are reversed in the polarity and cancel each other between both threshold values. As a result, as shown in FIGS. 17 and 18, a difference between the state of FIG. 17 (the voltage Vin is slightly lower than the original threshold voltage) and the state of FIG. 18 (the voltage Vin is slightly higher than the original threshold voltage) is reduced as compared with the case of FIGS. 13 and 14. The amount of offset of the threshold voltage should be 1/32 or more of a reference voltage, e.g. supply voltage. FIGS. 17 and 18 show an example in which the amount of offset of the threshold voltage is set to ±0.1 V.

In this example, the amount of offset of the above threshold values may be switched over by the output of the comparator. For example, when the output of the comparator changes from 0 to 1, the amount of offset is switched over from +0.1 V to −0.1 V. With this measure, there is no distinct transition point at which the operation point of the integrator suddenly changes between positive and negative. As a result, there is obtained the effect of reducing the DNL due to the dispersion of the error of the integrator leakage in the same manner as described above.

The effects of dispersing the operation point of the integrator are put together as follows. First, as described above, the integrator leakage of the operational amplifiers are offset and reduced. Also, there is no discontinuous change of the integrator leakage between positive and negative regardless of the input voltage Vin. As a result, the DNL is reduced. For that reason, the error due to the finite gain of the operation amplifier can be suppressed to about ¼ or less. As a result, in the case of comparison with the same precision, the gain of the operation amplifier is reduced as much as the suppressed error.

For example, for specification where the gain of about 40,000 is required in case the operation point is not dispersed, the required gain is suppressed to about 10,000 by dispersing the operation point. For that reason, very high gain operational amplifiers are not necessary, and a circuit becomes simple as much. Also, since the channel length of a transistor can be shortened, it is advantageous in the chip area, the precision, and the operation speed.

[Division of Sampling Capacitor into Two]

As is apparent from FIG. 1, in both of the ΣΔ modulators M1 and M2, the sampling capacitors Cs are divided into two. In other words, the ΣΔ modulator M1 has sampling capacitors Cs11 and Cs12 which are arranged in parallel. Likewise, the ΣΔ modulator M2 has sampling capacitors Cs21 and Cs22 which are arranged in parallel.

In the above description, that the sampling capacitor Cs is divided into two is not positively used as the parallel oversampling operation. However, this structure makes it possible to conduct arithmetic operation by five kinds of values consisting of −Vref, −0.5*Vref, 0, 0.5*Vref, and Vref. Then, the mismatch of the capacitors can be canceled.

More specifically, in the above-mentioned sampling operation described with reference to FIGS. 6 and 7, the ΣΔ modulators (M2 in FIG. 6, M1 in FIG. 7) at the integration side are brought into a state shown in FIGS. 19 to 22 by the operation of the switch S2 to conduct the operation. The ΣΔ modulator M1 is described in FIGS. 19 to 22, but the same is applied to the ΣΔ modulator M2. The description of FIGS. 6 and 7 is applied to switches in portions that do not appear in FIGS. 19 to 22. The connection state of the ΣΔ modulator (M1 in FIG. 6, M2 in FIG. 7) at the sampling side is the same as that described in FIGS. 6 and 7.

Figure 19:
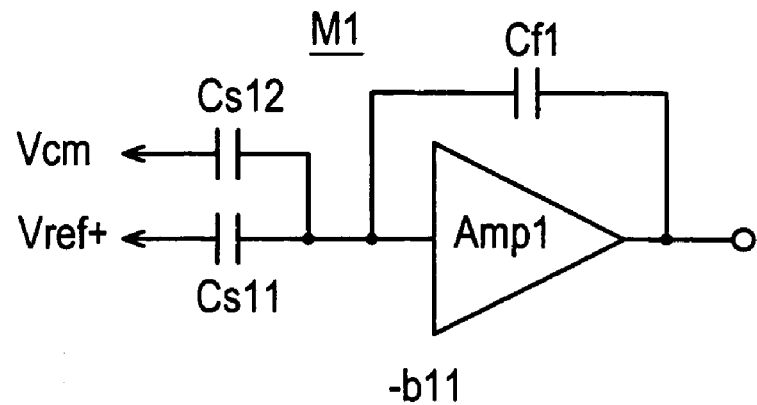
FIG. 19 is an explanatory diagram showing mismatch cancellation using two division of a sampling capacitor.

FIG. 19 shows a state in which the sampling capacitor Cs11 is connected to Vref+, and the sampling capacitor Cs12 is connected to the common-mode level, respectively. This state is a state in which arithmetic operation of −0.5* Vref is conducted. However, since the mismatch of the capacitors exists, strictly, the arithmetic operation is conducted with the following values.

−b11*Vref where b11 is represented by the following expression.

$$b11 = Cs11/(Cs11+Cs12)$$

where Cs11 and Cs12 are capacitances of the sampling capacitors Cs11 and Cs12, respectively.

Figure 20:
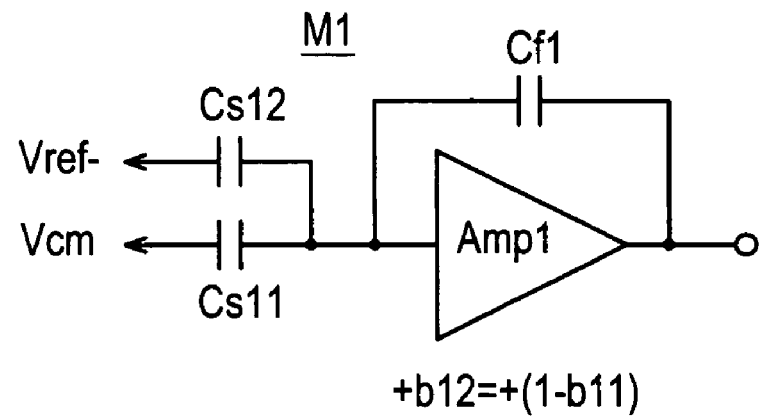
FIG. 20 is an explanatory diagram showing mismatch cancellation using two division of the sampling capacitor.

FIG. 20 shows a state in which the sampling capacitor Cs11 is connected to the common-mode level, and the sampling capacitor Cs12 is connected to Vref−, respectively.

This state is a state in which arithmetic operation of 0.5*Vref is conducted. However, since the mismatch of the capacitors exists, strictly, the arithmetic operation is conducted with the following values.

−b12*Vref where b12 is represented by the following expression.

b12=Cs12/(Cs11+Cs12)=1−b11

Figure 21:
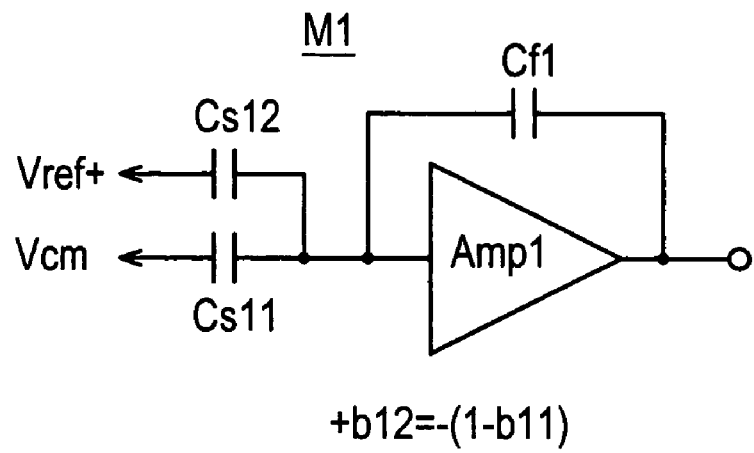
FIG. 21 is an explanatory diagram showing mismatch cancellation using two division of the sampling capacitor.

FIG. 21 shows a state in which the sampling capacitor Cs11 is connected to the common-mode level, and the sampling capacitor Cs12 is connected to Vref+, respectively. This state is a state in which arithmetic operation of −0.5*Vref is conducted. However, since the mismatch of the capacitors exists, strictly, the arithmetic operation is conducted with −b12* Vref.

Figure 22:
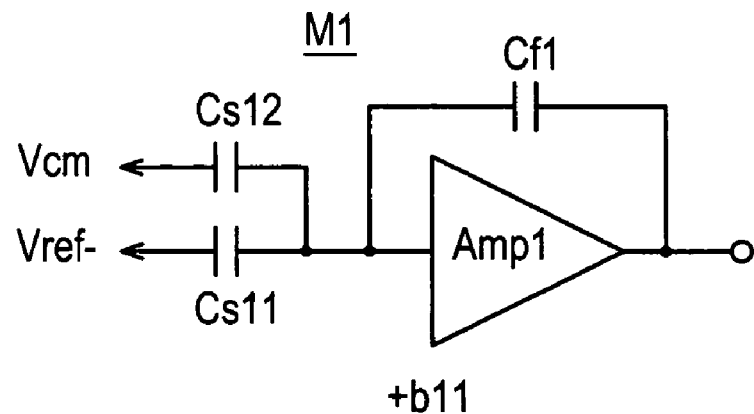
FIG. 22 is an explanatory diagram showing mismatch cancellation using two division of the sampling capacitor.

FIG. 22 shows a state in which the sampling capacitor Cs11 is connected to Vref−, and the sampling capacitor Cs12 is connected to the common-mode level, respectively. This state is a state in which arithmetic operation of 0.5* Vref is conducted. However, since the mismatch of the capacitors exists, strictly, the arithmetic operation is conducted with b11*Vref.

In this example, the values of b11 and b12 are substantially 0.5, but because of the mismatch of the capacitors, b11 and b12 are actually slightly deviated from 0.5. In addition, the arithmetic values in the state of FIG. 19 and the state of FIG. 22 have a relationship different in only sign. The same is applied to the state of FIG. 20 and the state of FIG. 21. For that reason, the arithmetic operation of 0.5*Vref is conducted in the state of FIG. 22 after the arithmetic operation of −0.5*Vref is conducted in the state of FIG. 19, thereby making it possible to cancel the mismatch. Also, the arithmetic operation of −0.5*Vref is conducted in the state of FIG. 21 after the arithmetic operation of 0.5*Vref is conducted in the state of FIG. 20, thereby making it possible to cancel the mismatch.

The sampling capacitor is divided into two, thereby making it possible to more finely control the output voltage. In other words, the output voltage can be maintained within a narrow range. Accordingly, the amplifier is capable of being used while the high gain is maintained within a linear range. Also, the operation point of the integrator can be shifted with the width of 0.5*Vref. For that reason, the polarity change becomes easy, and the leakage of the integrator can be reduced. Accordingly, a precision in the arithmetic operation is high. Further, addition and subtraction can be conducted with the width of 0.5*Vref (b11*Vref or b12*Vref) before the integration value is transferred from the integration capacitor to the sampling capacitor. For that reason, the output range at the time of transfer can be suppressed within a range of ±0.25*Vref.

On the other hand, the matching error due to the two division of the sampling capacitor can be canceled as described above. In other words, the mismatch of the divided sampling capacitors is canceled by ±0.5*Vref arithmetic operation two by two. For that reason, even if ±0.5*Vref arithmetic operation is repeated, the error is not stored. As a result, in fact, there is provided the ratio independent high-precision multi-bit ΣΔ modulator.

[Addition of Integration Value (1)]

As a method of adding the integration values (residues) of the ΣΔ modulators M1 and M2, there is direct sampling. In the direct sampling, in the ΣΔ modulator M1, electric charge is transferred back to the sampling capacitor Cs (divided into two in this embodiment) from the integration capacitor Cf once. Then, the electric charge is sampled by the sampling capacitor of another ΣΔ modulator. As a result, the integration value is added in the integrator of one ΣΔ modulator. In FIG. 4, the direct sampling is conducted between a time t2 and a time t3.

Figure 23:
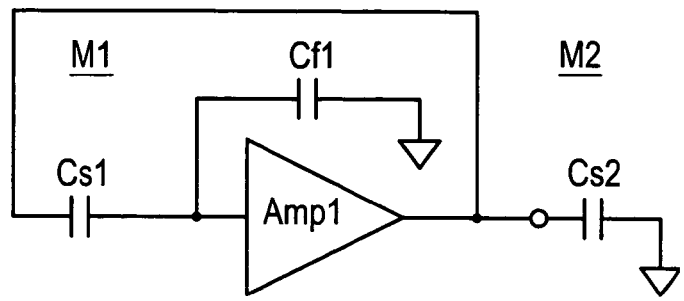
FIG. 23 is an explanatory diagram showing direct sampling of an integration value.

The direct sampling is conducted as shown in FIG. 23. FIG. 23 shows a status in which the integration value of the ΣΔ modulator M1 is sampled by the ΣΔ modulator M2. In FIG. 23, the sampling capacitors Cs11 and Cs12 are collectively displayed as Cs1. Likewise, the sampling capacitors Cs21 and Cs22 are collectively displayed as Cs2.

The states of the respective switches in the state of FIG. 23 are indicated as follows:

ΣΔ modulator M1
Switches S1 to S3 are off.
Switches S4 and S5 are on.
Switch S6 is off.
Switches S7 to S9 are on.
Switch S10 is off.
Switch S21 is off.
ΣΔ modulator M2
Switches S11 and S12 are off.
Switch S13 are on.
Switch S14 is off.
Switches S18 and S19 are off.
Switch S20 is on.

In this way, the integration value of the integration capacitor Cf1 in the ΣΔ modulator M1 is sampled by the sampling capacitor Cs2 of the ΣΔ modulator M2 through the sampling capacitor Cs1 and the switches S8, S9, and S20. As a result, the integration values of those ΣΔ modulators M1 and M2 are added together. In this way, the integration value is transferred back to the capacitor Cs1 that has conducted sampling at the time of sampling (parallel oversampling) once, to thereby prevent an influence of the capacitor variation. As a result, the ratio independent high-precision operation can be conducted.

Also, in this example, the switch S21 of the ΣΔ modulator M1 is off, so that a load capacitor CL1 is separated from the circuit. For that reason, the addition process is conducted without influence of the capacitance of the load capacitor CL1, resulting in a high speed. Conversely, the integration value of the ΣΔ modulator M2 can be sampled by the ΣΔ modulator M1.

[Addition of Integration Value (2)]

Figure 24:
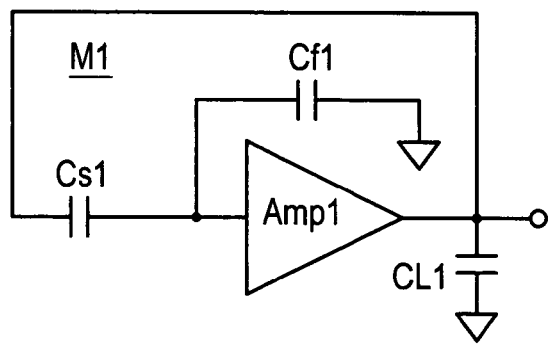
FIG. 24 is an explanatory diagram showing sampling with holding of an integration value.
Figure 25:
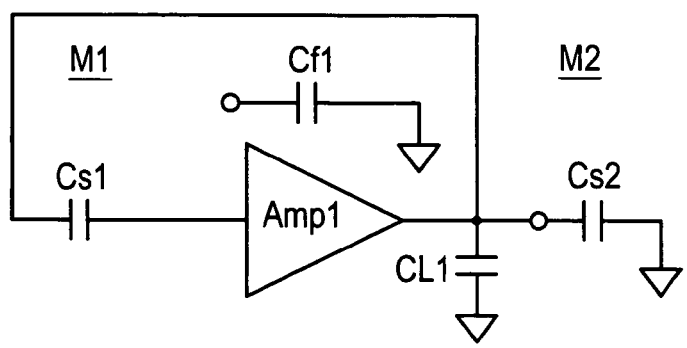
FIG. 25 is an explanatory diagram showing sampling with holding of an integration value.

In the adding operation of the integration values (residues) of the ΣΔ modulators M1 and M2, holding can be conducted. In other words, after the integration value of the integration capacitor Cf1 is transferred back to the sampling capacitor Cs1, first, the integration capacitor Cf1 is separated from the circuit. With this operation, the operational amplifier Amp1 is in the holding state. In this state, the sampling capacitor Cs2 of the ΣΔ modulators M2 is connected to an output of the operational amplifier Amp1 to conduct sampling by the sampling capacitor Cs2. FIG. 24 shows a state in which the integration value of the integration capacitor Cf1 is transferred back to the sampling capacitor Cs1. FIG. 25 shows a state in which the operational amplifier Amp1 is held to conduct sampling by the sampling capacitor Cs2.

The states of the respective switches in the state of FIG. 24 are represented as follows.

ΣΔ modulator M1
Switches S1 to S3 are off.
Switches S4 and S5 are on.
Switch S6 is off.
Switches S7 to S9 are on.
Switch S10 is off.

Switch S21 is on.
ΣΔ modulator M2
Switch S20 is off.
The states of the respective switches in the state of FIG. 25 are represented as follows.
ΣΔ modulator M1
Switches S1 to S3 are off.
Switch S4 is on.
Switches S5 and S6 are off.
Switches S7 to S9 are on.
Switch S10 is off.
Switch S21 is on.
ΣΔ modulator M2
Switches S11 and S12 are off.
Switch S13 is on.
Switch S14 is off.
Switches S18 and S19 are off.
Switch S20 is on.

In this way, the adding operation by sampling with holding has the following advantages. First, when the integration value of the integration capacitor Cf1 is transferred back to the sampling capacitor Cs1 (FIG. 24), the ΣΔ modulator M2 can be separated from the ΣΔ modulator M1 (Switch S20 is off). For that reason, during that time, the ΣΔ modulator M2 is capable of conducting another arithmetic operation. As a result, it is possible to conduct processing at a higher speed and with a higher precision. As another arithmetic operation that can be conducted by the ΣΔ modulator M2, there is, for example, the output adjustment of the operational amplifier Amp2.

Also, the sampling with holding has smaller error of the adding operation than the direct sampling. This is because the error that is sampled to the sampling capacitor Cs2 in the holding state (FIG. 25) is very small. For that reason, the error in total is relatively smaller although the number of processing is increased by one step as compared with the direct sampling.

The reason is stated below. First, the thermal noise power (which dimension is $V^2$) of the operational amplifier is approximately given by $Von^2$ of the following expression when a flicker noise is ignored.

$$Von^2 = (k*T/CLeff)*(nf/F)$$

where k is a Boltzmann constant, T is an absolute temperature, CLeff is an effective load capacitance of the output side of the operational amplifier, nf is a noise index of the operational amplifier, and F is a feedback factor of a feedback system.

That is, the thermal noise power is inverse proportional to the feedback factor F. When the integration value of the integration capacitor Cf1 is transferred back to the sampling capacitor Cs1, the feedback factor F is small (about ¼ to ⅓), and therefore the thermal noise power $Von^2$ is large. For that reason, the error in the case of the direct sampling comes under the above influence.

In the case of the sampling with holding, when the integration value of the integration capacitor Cf1 is transferred back to the sampling capacitor Cs1, the sampling capacitor Cs2 of the ΣΔ modulator M2 is separated from the circuit (FIG. 24). Thereafter, the electric charge that remains in the integration capacitor Cf1 when the integration capacitor Cf1 is separated from the circuit cause the error. The amount of it is F times larger than the output noise of the operational amplifier. This is $F^2$ times as the thermal noise power. In other words, the thermal noise power in this state is represented by $V(Cf)n^2$ of the following expression.

$$V(Cf)n^2 = Von^2*F^2 = (k*T/CLeff)*(nf/F)*F^2 = (k*T/CLeff)*nf*F$$

In order to convert $V(Cf)n^2$ to input-referred noise, $V(Cf)n^2$ is multiplied by $(Cf/Cs)^2$. When it is assumed that $(Cf/Cs)$ is 2, and the feedback factor F is ⅓.5, this is 16/49 (about 0.33) times larger than $Von^2$.

Thereafter, as described above, the integration capacitor Cf1 is separated from the circuit into the holding state. The feedback factor F in the holding state is as large as about ½ to 1, depending on the parasitic capacitance. Accordingly, the thermal noise power $Von^2$ in this state is smaller than that at the time of transferring from the integration capacitor Cf1 to the sampling capacitor Cs1. For that reason, the noise at the time of sampling by the sampling capacitor Cs2 is small.

Further, the feedback factor F at the time of holding is higher than that in other arithmetic operation steps. For that reason, the settling time is short (in the case where the effective load capacitance CLeff is the same). Accordingly, it is possible to increase the effective load capacitance CLeff by connecting an additional load capacitance to the output side of the operational amplifier. This makes it possible to further reduce the noise. This is because the thermal noise power $Von^2$ is inversely proportional to the effective load capacitance CLeff. This causes the switch S21 to be on in FIG. 25. Likewise, even at the time of transferring from the integration capacitor Cf1 to the sampling capacitor Cs1, that the effective load capacitance CLeff is increased by connection of the additional load capacitor is effective in a reduction of the noise and settling time. For that reason, the switch S21 is on in FIG. 24.

[Addition of Integration Value (3)]

In the two-step adding operation which is explained hereinafter, the arithmetic operation can be offset, thereby making it possible to further suppress the error. In other words, a constant value is added or subtracted (offset) with respect to the sampling capacitor Cs1 before transferring from the integration capacitor Cf1 to the sampling capacitor Cs1. In this state, transfer and sampling by the sampling capacitor Cs2 are conducted, and the sampling result is added to the ΣΔ modulator M2 (first addition). Thereafter, the reverse polarity value of the offset before transferring is sampled by the sampling capacitor Cs2, and then added to the ΣΔ modulator M2 (second addition). Thus, offset is canceled to obtain the final added value.

As a result, the output of the operational amplifier Amp1 at the time of starting transfer can fall within a range of from the half of −offset value to the half of +offset value. Thus, a variation in the output value of the operational amplifier Amp1 with the transfer can fall within a range where the characteristic of the operational amplifier is higher in the gain and linear. As a result, the error can be suppressed. In particular, the error occurring at the time of transfer may be dominant in the entire error. Because the feedback factor F is low at transferring, the inverse of it dominates the quantity of the error. Accordingly, the suppression of the error at the time of transfer works effectively for suppressing the entire error. Also, since a request for the gain of the operational amplifier and the output voltage range is reduced, the low-cost, high-speed, and high-precision design can be conducted easily.

In this example, 0.5 Vref can be used as the offset value by using the fact that the sampling capacitor Cs1 is divided into two. Strictly speaking, as described above, the two-divided capacitors are mismatched but can be canceled. More particularly, in the case where the output of the operational amplifier Amp1 before transfer, that is, the residue value after parallel oversampling is larger than 0.25 Vref, the offset of −0.5 Vref may be conducted. In the case where the output of the operational amplifier Amp1 before transfer is smaller than −0.25 Vref, the offset of 0.5 Vref may be conducted. As a result, the output range can be suppressed within a range of ±0.25.

Figure 26:
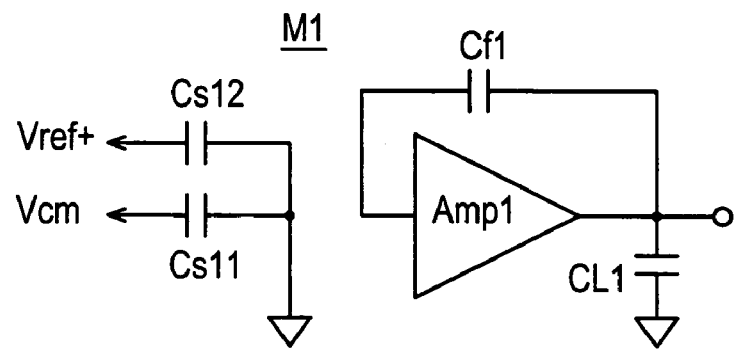
FIG. 26 is an explanatory diagram showing a status in which the sampling capacitor is subjected to offsetting before transfer.

In other words, the sampling capacitor Cs1 before transfer is offset as shown in FIG. 26. In the ΣΔ modulator M1 of this state, the respective switches are in the following states.

Switch S1 is off.
Switch S2 is connected to the common-mode level with respect to Cs11 and to Vref+ with respect to Cs12.
Switch S3 is on.
Switch S4 is off.
Switches S5 and S6 are on.
Switch S7 is off.
Switches S8 to S10 are off.
Switch S21 is on.
Switch S22 is off.

Figure 27:
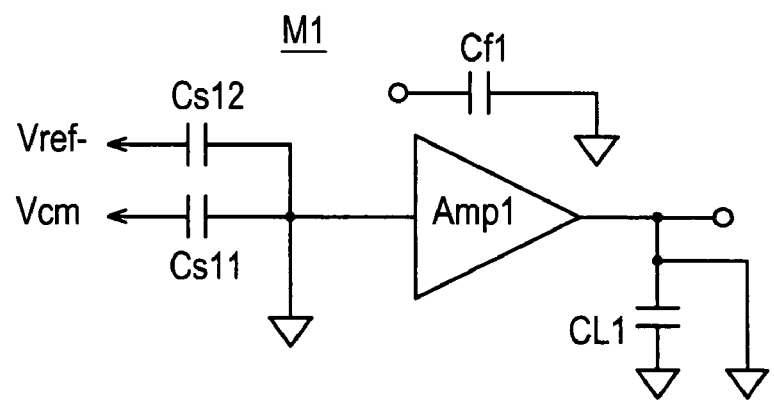
FIG. 27 is an explanatory diagram showing a status in which reverse offset and mismatch are sampled.

Thereafter, the transfer described with reference to FIG. 24 and the sampling described with reference to FIG. 25 are conducted. As a result, the first addition is conducted in a state where the offset of 0.5 Vref is in effect. Thereafter, as shown in FIG. 27, the reverse offset is sampled. In the ΣΔ modulator M1, the respective switches are in the following states.

Switch S1 is off.
Switch S2 is connected to the common-mode level with respect to Cs11 and to Vref− with respect to Cs12.
Switches S3 and S4 are on.
Switches S5 and S6 are off.
Switch S7 is on.
Switches S8 to S10 are off.
Switches S21 and S22 are on.

In FIGS. 26 and 27, the connection destination of the switch S2 with respect to Cs12 may be exchanged. Also, in FIGS. 26 and 27, the roles of Cs11 and Cs12 may be replaced with each other.

Thereafter, as described with reference to FIG. 25, the holding state is set, and the reverse offset is sampled to the sampling capacitor Cs2. This is the second addition. With this operation, the offset is canceled. Also, the mismatch of the sampling capacitors Cs11 and Cs12 is also canceled. Further, in the holding state, the feedback factor F is high (about 0.67 to 1), and the generated error is relatively small. Thus, the high-precision final added value is obtained.

[Pipelined Algorithmic Operation (1)]

The algorithmic operation (FIGS. 10 and 11) at the times t3 to t4 in FIG. 4 has the following features. That is, the ΣΔ modulator in which the sampling capacitor has been divided into two is made up of circuit elements (two-divided sampling capacitors, operational amplifier, and comparator) which are substantially common to the pipelined algorithmic A/D converter. For that reason, the pipelined algorithmic A/D converting process can be realized by the addition of only switches without adding a new circuit part.

The added switches are switches S10 and S20 in FIG. 1. That is, those switches are switches that connect an output of the operational amplifier in one of the ΣΔ modulators to the sampling capacitor of the other ΣΔ modulator. The switch S10 is a switch for connecting the output of the operational amplifier Amp2 to the sampling capacitors Cs11 and Cs12 (on in FIG. 10). The switch S20 is a switch that connects the output of the operational amplifier Amp1 to the sampling capacitors Cs21 and Cs22 (on in FIG. 11). One of the switches S10 and S20 is also used in the residue addition process (S20 in the example of FIG. 8). Accordingly, the number of switches that are added for only the algorithmic operation is actually only one.

In other words, it is unnecessary to provide a dedicated operational amplifier of post-operation (algorithmic operation). This is because the operational amplifier that is used in the pre-operation (parallel oversampling, the addition of residues) can be used in the post-operation only by changing over the switches. Also, the pipelined algorithmic A/D conversion has the following two advantages. That is, the number of switches that are connected to the input node of the operational amplifier is minimized. Also, since the conversion of one bit can be conducted by ½ clocks, the algorithmic operation is suitable for high speed.

[Pipelined Algorithmic Operation (2)]

In the algorithmic operation of the A/D converter according to this embodiment, a reduction of the error can be further conducted. For the explanation, the outline of the error that occurs in the algorithmic operation will be described. In the description of the algorithmic operation in FIGS. 10 and 11, the connection of the two-divided sampling capacitors at the multiply-by-two operation side is described with reference to Table 1 as a general example.

Figure 28:
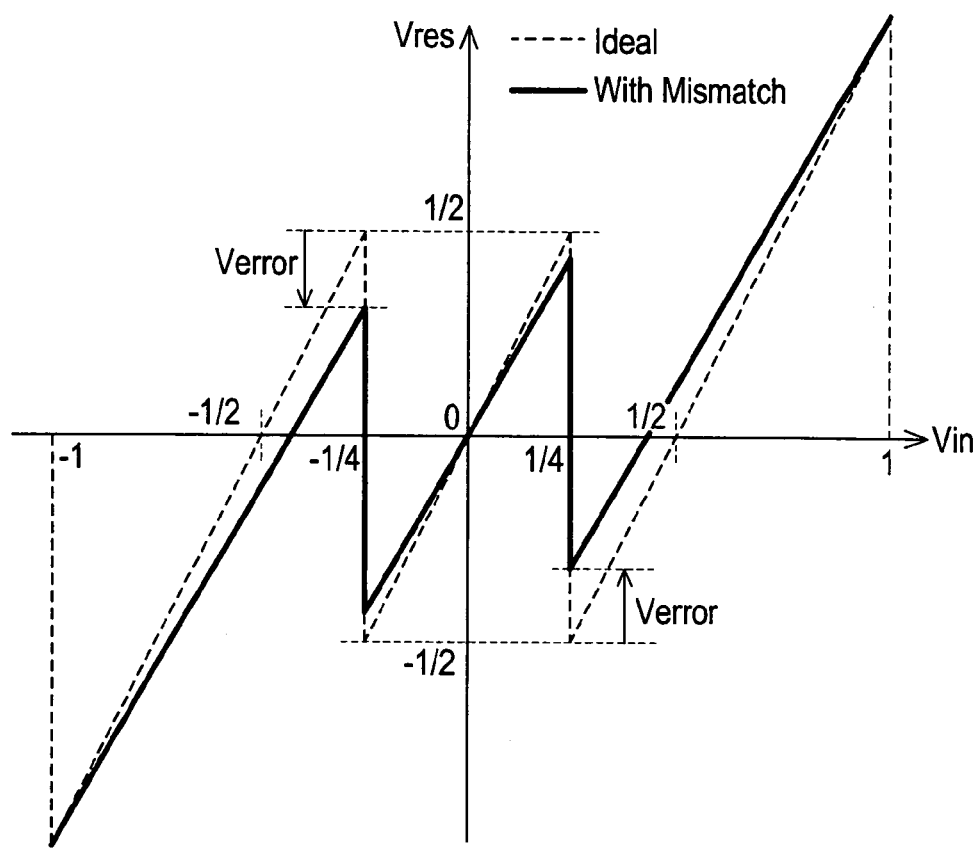
FIG. 28 is a graph showing transfer characteristics in a general algorithmic operation.

The transfer characteristic in the case where the two-divided sampling capacitors are thus operated is shown in a graph of FIG. 28. The horizontal axis in the graph indicates the input voltage Vin. The vertical axis indicates the output Vres after arithmetic operation. Both of the horizontal axis and the vertical axis indicate values that are standardized by a reference voltage Vref. As shown in Table 1, since the connection destination of the sampling capacitors Cs21 is switched over at ±0.25 Vref of input voltage Vin, Vres is discontinuously changed there. When the two-divided sampling capacitors Cs21 and Cs22 are completely identical in the capacitance with each other, the transfer characteristic is indicated by a broken line. However, in fact, since there exists mismatch, the transfer characteristic indicated by a solid line is obtained. The solid line in FIG. 28 indicates an example in the case of Cs21<Cs22.

In this example, there is difference between the solid and broken lines in FIG. 28, and this indicates that there is some error. In particular, when the input Vin before the arithmetic operation which is a switching point is ±0.25 Vref, its difference is most remarkable. Further, in this situation, a width of the step of the graph is different between the solid line and the broken line. This is caused by the mismatch of the capacitors.

Figure 29:
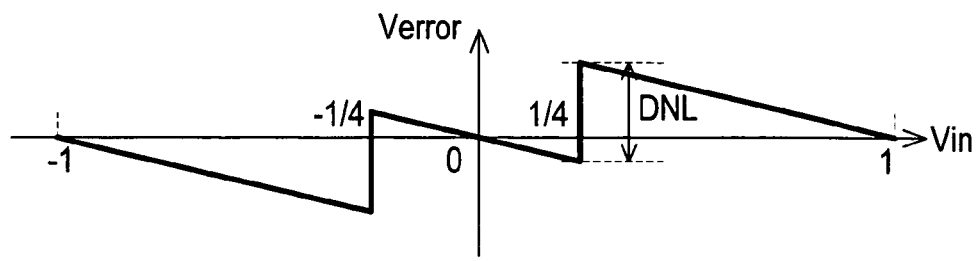
FIG. 29 is a graph showing mismatch error characteristics in the general algorithmic operation.

Two arrows Verror shown in FIG. 28 indicate a difference between the solid line and the broken line in that situation. A graph of Verror (=solid line−broken line) with respect to the before-operation output Vo is shown in FIG. 29. The scales of the horizontal axis and the vertical axis are identical with those in FIG. 28. It is found from FIG. 29 that not only Verror is peaked when the input Vin is ±0.25 Vref, but also the left and right sides of the peak are discontinuous. The discontinuity is basically caused by the mismatch of the capacitors. The DNL occurs when the state of the switch changes.

On the other hand, there has been known a manner called "CFCS (Commutated Feedback Capacitance Switching)" in which the roles of Cs21 and Cs22 are switched over according to the input Vin. In this manner, when the switching point is 0 or ±0.5 Vref, little DNL is generated there. But when the switching point is ±0.25 Vref, a certain amount of DNL is generated. The pipelined algorithmic operation suffers from a problem that ±0.25 Vref is frequently used as the switching point.

On the contrary, in the A/D converter according to this embodiment, the first multiply-by-two operation of the algorithmic operation can be conducted in the following procedure.

Figure 30:
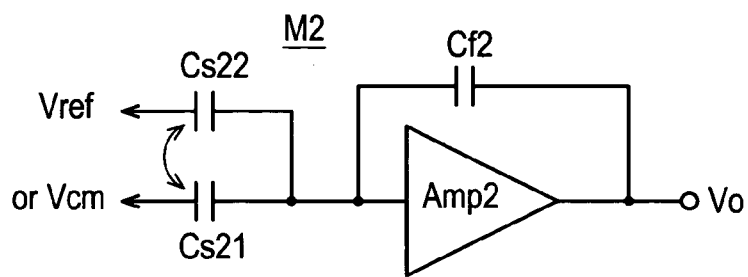
FIG. 30 is a graph showing a status in which addition or subtraction is conducted at the time of integration.
Figure 31:
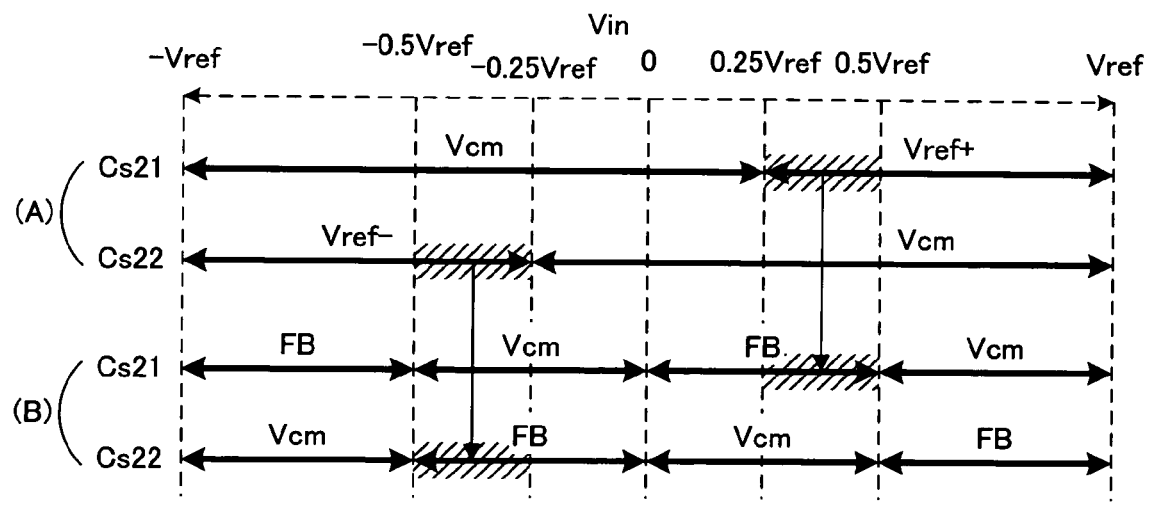
FIG. 31 is an explanatory diagram showing a connection destination of the two-divided sampling capacitor in the algorithmic operation.

(1) Sampling of the residue;
(2) Integration, addition, and subtraction;
(3) Reset of the sampling capacitor;
(4) Transfer back to the sampling capacitor; and
(5) Multiply-by-two operation Among them, (1) and (2) are processes that belong to "addition of the residue" before conducting the algorithmic operation. The sampling of (1) may be conducted as shown in FIG. 8. The integration, etc., of (2) are conducted by bringing the ΣΔ modulator M2 to a state shown in FIG. 30. The two-divided sampling capacitors Cs21 and Cs22 of the ΣΔ modulator M2 in this state are connected to the connection destination shown in (A) of FIG. 31 according to the input Vin due to the operation of the switch S12.

In other words, the sampling capacitor Cs21 is connected to the common-mode level when Vin<0.25 Vref, and connected to Vref+ when 0.25 Vref<Vin. The sampling capacitor Cs22 is connected to Vref− when Vin<−0.25 Vref, and connected to the common-mode level when −0.25 Vref<Vin. As a result, addition or subtraction of the reference voltage Vref is conducted in one of the two-divided sampling capacitors except that the input Vin falls within a range of ±0.25 Vref, in parallel to the integration (electric charges are taken in the integration capacitor Cf2 from the sampling capacitor Cs2).

Figure 32:
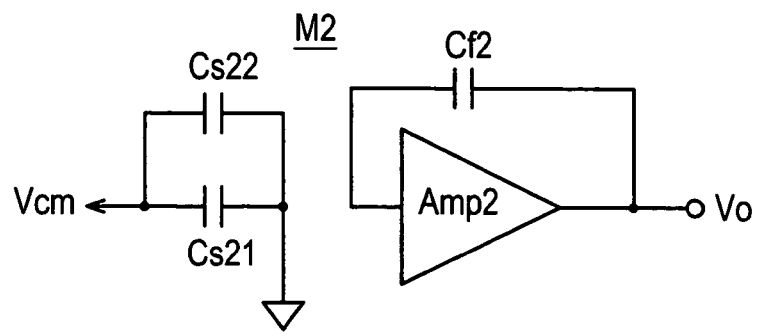
FIG. 32 is an explanatory diagram showing reset of the sampling capacitor in conducting the algorithmic operation.
Figure 33:
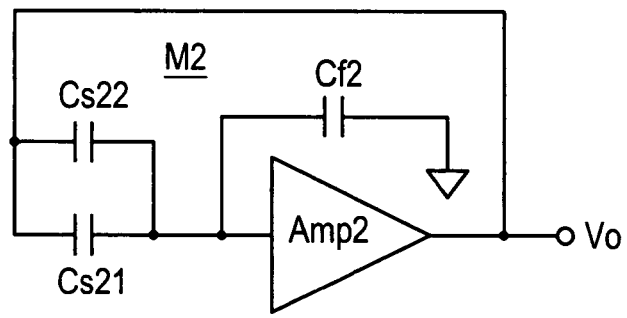
FIG. 33 is an explanatory diagram showing a status in which electric charges taken in an integration capacitor are transferred back to the sampling capacitor.
Figure 34:
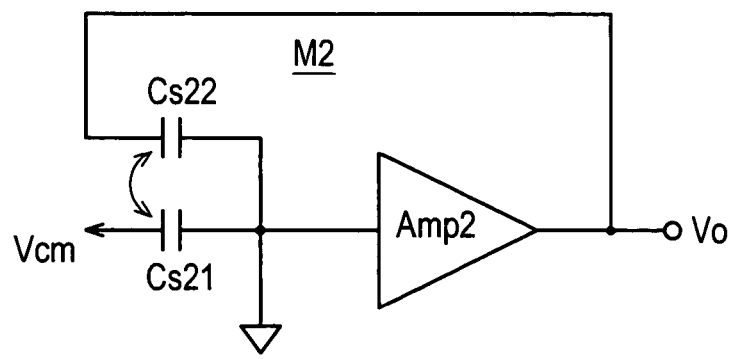
FIG. 34 is an explanatory diagram showing multiply-by-two operation in the algorithmic operation.

Then, after the reset (3) shown in FIG. 32 is conducted, the electric charge is transferred back to the sampling capacitor Cs2 from the integration capacitor Cf2 as shown in FIG. 33. This is the operation of (4). Then, multiply-by-two operation (5) is conducted due to feedback as shown in FIG. 34. In this situation, the connection of the two-divided sampling capacitors Cs21 and Cs22 in the ΣΔ modulator M2 is conducted as shown in (B) of FIG. 31 by the operation of the switches S12, S18, and S19 according to the input Vin.

In other words, when Vin<−0.5 Vref and 0<Vin<0.5 Vref, the sampling capacitor Cs21 is used for feedback by the switch S18, and the sampling capacitor Cs22 is connected to the common-mode level by the switch S12. When −0.5 Vref<Vin<0 and 0.5 Vref<Vin, conversely, the sampling capacitor Cs22 is used for feedback by the switch S19, and the sampling capacitor Cs21 is connected to the common-mode level by the switch S12.

As a result, when −0.5 Vref<Vin<−0.25 Vref and 0.25 Vref<Vin<0.5 Vref, it is found that the sampling capacitor that is used to addition or subtraction at the time of integration is used as the feedback capacitor at the time of the multiply-by-two operation. Those timings are indicated by oblique lines and vertical arrows in FIG. 31. This can be realized by a system in which after the sampled residue electric charge at above-mentioned (1) is stored in another capacitor (Cf2) once, the electric charge is transferred back to the sampling capacitor. Also, the roles of the two-divided sampling capacitors Cs21 and Cs22 are replaced with each other depending on the positive and negative of the input Vin. In this description, addition and subtraction are conducted at the time of integration. However, the timing of addition and subtraction is not limited to this example. The addition and subtraction may be conducted until the electric charges are transferred back as shown in FIG. 33.

As a result, the following effects are obtained.

Figure 35:
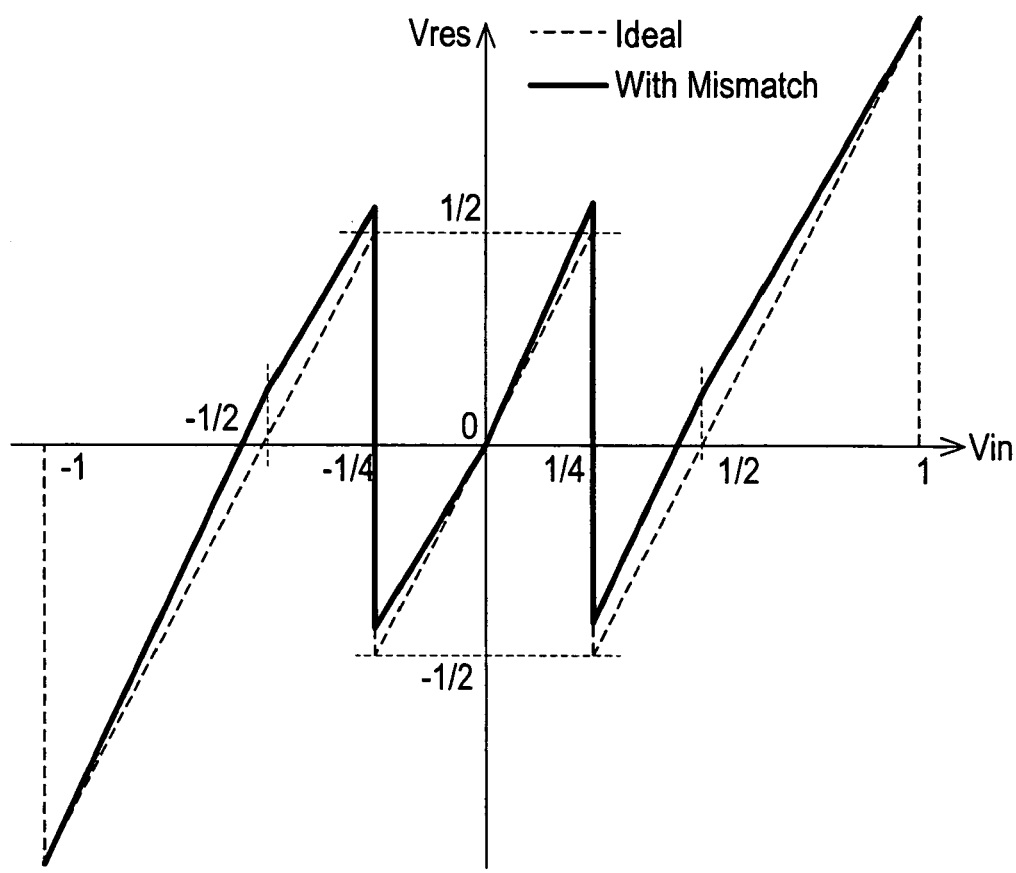
FIG. 35 is a graph showing the transfer characteristics in the algorithmic operation according to the embodiment.
Figure 36:
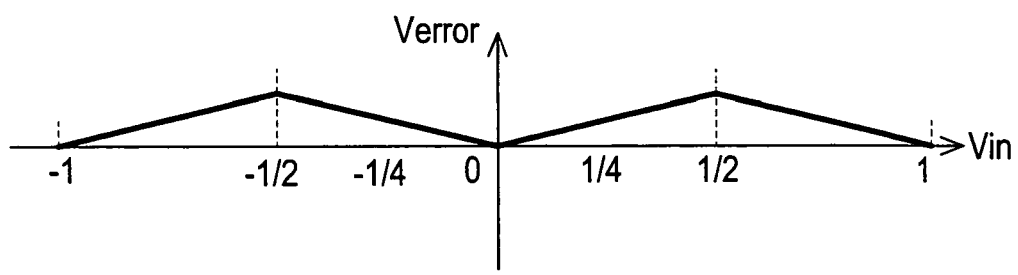
FIG. 36 is a graph showing the mismatch error characteristics in the algorithmic operation according to the embodiment.

First, DNL can be set to almost zero, if the amplifier gain is high enough. This will be described using the transfer characteristic. FIG. 35 shows the transfer characteristic in the case of conducting the algorithmic operation through the process shown in FIG. 30 and the subsequent figures. The scales of the vertical axis and the horizontal axis in the graph are identical with those in FIG. 28. The meanings of the solid line and the broken line are also identical with those in FIG. 28. As shown in the graph of FIG. 36, no DNL occurs. This is because the same capacitor that conducted addition and subtraction is used as the feedback capacitor when the input Vin is within the ranges −0.5 Vref to −0.25 Vref and 0.25 Vref to 0.5 Vref.

Also, in the case where the input Vin is outside of ±0.5 Vref, the roles of the two-divided sampling capacitors Cs21 and Cs22 are replaced with each other depending on their positive and negative. As a result, the entire INL is also suppressed. With this operation, the SDR and SNDR which are the distortion characteristics of the A/D converter are also improved.

By the way, no dedicated comparator is required for discrimination of ±0.5 Vref. This is because ±0.5 Vref can be discriminated by the comparator whose offset is zero after the electric charges are transferred back to the sampling capacitors Cs21 and Cs22 from the integration comparator Cf2 (FIG. 33). Also, sampling for canceling other mismatches may be conducted at the time of reset shown in FIG. 32.

As another effect, the speed of the entire operation is increased. In the arithmetic operation, since addition and subtraction are conducted before multiply-by-two operation, the output change amount at the time of multiply-by-two operation is small. For that reason, the slewing time is shortened. The settling precision of the first multiply-by-two operation in the algorithmic operation is a controlling factor of the speed of the entire arithmetic operation. Accordingly, in the arithmetic manner according to this embodiment, the arithmetic operation is fast.

[Switch Control Logic (1)]

In the A/D converter according to this embodiment, a non-overlap clock signal by a pair of latches and an AND gate is used in the switch control. The non-overlap means that when one switch changes over from on to off and another switch changes over from off to on at the time of a certain clock, those switches are not both on at the same time. If there is a moment in which both of those switches are on, an unintentional signal path may occur. This causes malfunction and is not preferable. Also, when one switch continues on over two clocks in succession, the switch should be continuously on without turning off temporarily. In this case, if there is a temporary off moment, there may occur a switch charge injection error which is not preferable.

The above operation will be described with reference to a block diagram shown in FIG. 37 and a timing chart shown in FIG. 38. In the block diagram, there are arranged a counter 101, a select logic 102, a first latch 103, a second latch 104, and an AND gate 105. The counter 101 receives a reset signal and a clock signal CK (or a delayed clock signal CKd). The counter 101 counts up during 16 clocks in one cycle shown in FIG. 4 on the basis of those signals.

Figure 37:
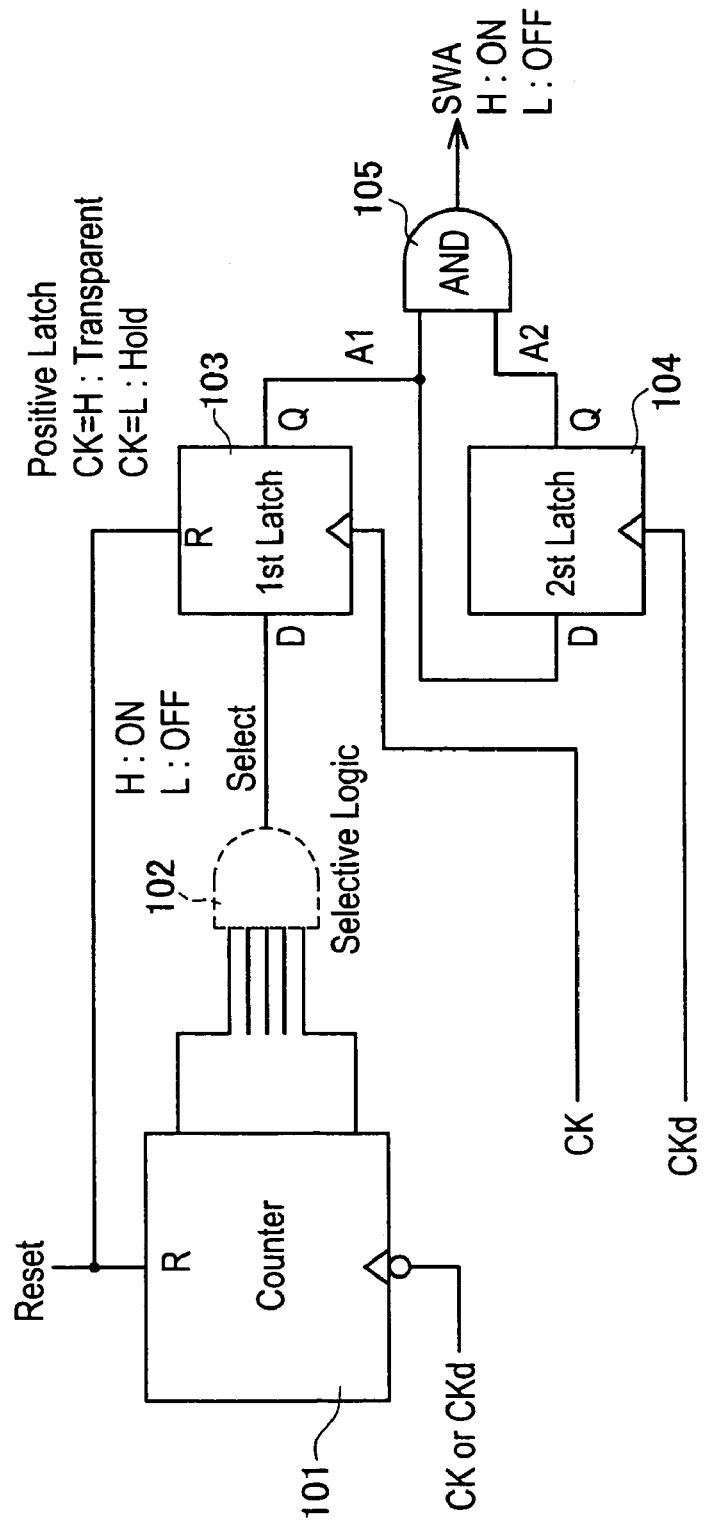
FIG. 37 is a block diagram showing a switch control logic in the A/D converter according to the embodiment.

The selective logic 102 to the AND gate 105 are shown as one set in FIG. 37. However, in fact, the set exists for each of the switches in the ΣΔ modulators M1 and M2. In addition, for the switches S2 and S12 that take various states, there are a number of sets required for realization of the states.

The selective logic 102 is a logic circuit that outputs a selecting signal for the corresponding switch. The selecting signal is high in clock No. in FIG. 38 where the corresponding switch should be on, and low in clock No. in FIG. 38 where the corresponding switch should be off. A logic pattern is set in advance so that the above signals are outputted according to the count value of the counter 101.

Both of the first latch 103 and the second latch 104 are positive latches. That is, the signal of an input terminal D is allowed to pass through to an output terminal Q at a rising edge of the clock signal. In other cases, there is no change in the state of the output terminal Q. The first latch 103 receives the selecting signal at the input terminal D. Also, the first latch 103 receives the clock signal CK. The second latch 104 receives an output signal A1 of the first latch 103 at the input terminal D. Also, the second latch 104 receives a delayed clock signal CKd.

The AND gate 105 outputs the logical AND of the output signal A1 of the first latch 103 and the output signal A2 of the second latch 104. This is an operation signal SWA of the corresponding switch. The corresponding switch is on when the operation signal SWA is high, and off when the operation signal SWA is low.

Figure 38:
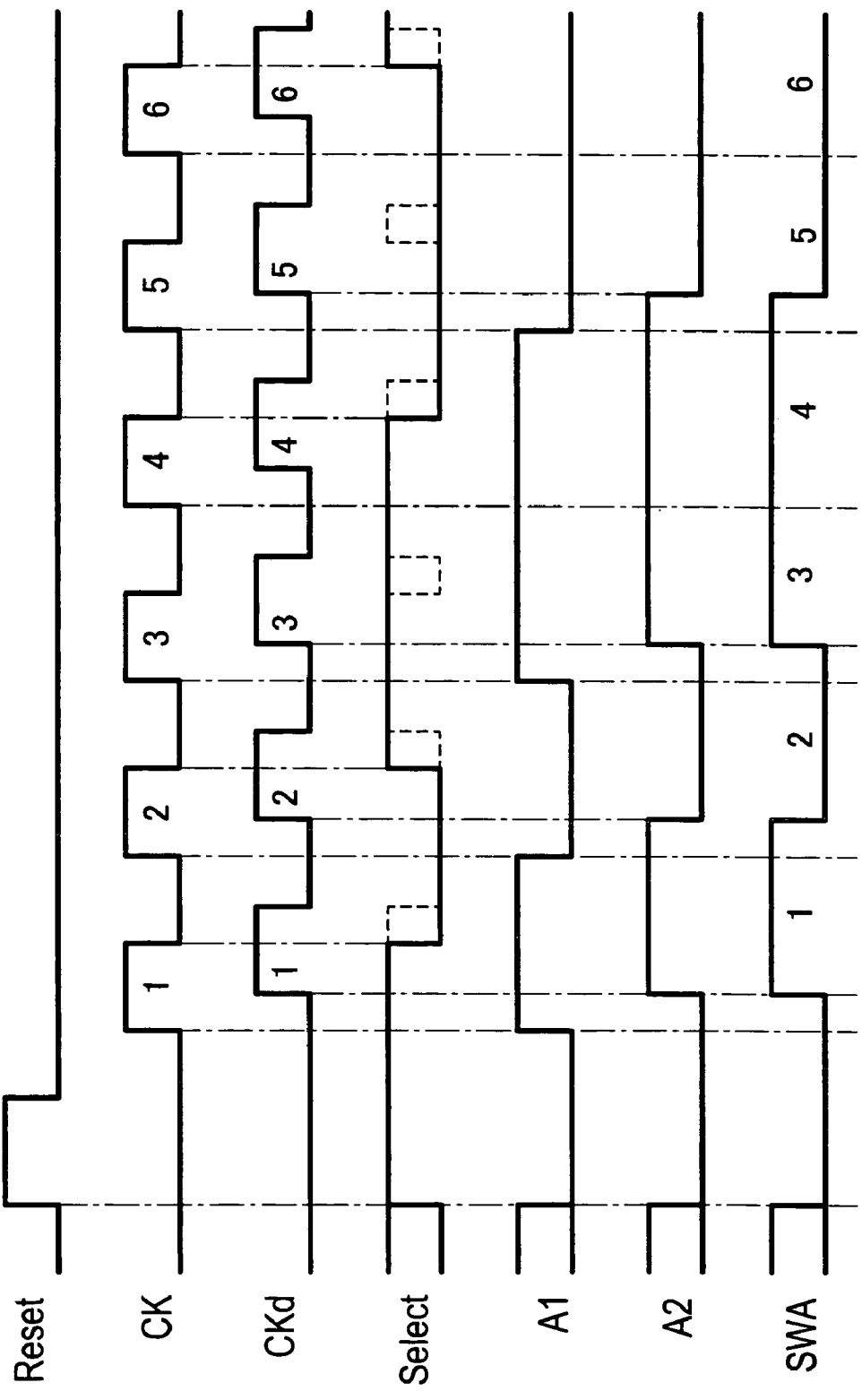
FIG. 38 is a timing chart for explaining a switch control in the block diagram of FIG. 37.

FIG. 38 is a timing chart in the case where the corresponding switch is on at a clock 1, off at a clock 2, on at clocks 3 and 4, and off at clocks 5 and 6.

In this case, the selecting signal becomes high with the rising of a reset signal, low with the falling of a clock CK1, high with the falling of a clock CK2, and low with the falling of a clock CK4. In the case where the counter 101 operates upon receiving the delayed clock signal CKd, timings of changing the selecting signal are at falling times of the delayed clock signal CKd except for the reset time.

As a result, the output signal A1 of the first latch 103 becomes high at the rising of the clock CK1 (the selecting signal is high at this time), low at the rising of the clock CK2 (the selecting signal is low at this time), high at the rising of the clock CK3 (the selecting signal is high at this time), and low at the rising of the clock CK5 (the selecting signal is low at this time).

Then, the output signal A2 of the second latch 104 becomes high at the rising of a delayed clock CKd1 (the output signal A1 is high at this time), low at the rising of a delayed clock CKd2 (the output signal A1 is low at this time), high at the rising of a delayed clock CKd3 (the output signal A1 is high at this time), and low at the rising of a delayed clock CKd5 (the output signal A1 is low at this time).

As a result, the output signal of the AND gate 105, that is, the operation signal SWA of the switch becomes high at the rising of the delayed clock CKd1, low at the rising of the clock CK2, high at the rising of the delayed clock CKd3, and low at the rising of the clock CK5.

That is, the operation signal SWA depends on the rising timing of the delayed clock CKd at the time of rising to high, and depends on the rising timing of the clock CK at the time of falling to low. This operation is accomplished in all of the switches. For that reason, when from a state in which one switch is on and another switch is off, on/off of those switches are replaced in the subsequent clock, there exists a period of time when both of those switches are off. The length of that period is equal to a delay amount of the delayed clock CKd. As a result, malfunction caused when both of those switches are on is prevented. Also, when the on state continues over two clocks (from clock 3 to clock 4), the temporary off state does not occur. As a result, the switch charge injection error is also prevented.

In the above arrangement, the selecting signal may be inputted to the input terminal D of the second latch 104 instead of the output signal A1. Also, the AND gate 105 may be appropriately replaced by any one of a NAND gate, an OR gate, and a NOR gate depending on the direction of the logics of the respective portions (positive logic or negative logic).

[Switch Control Logic (2)]

Figure 39:
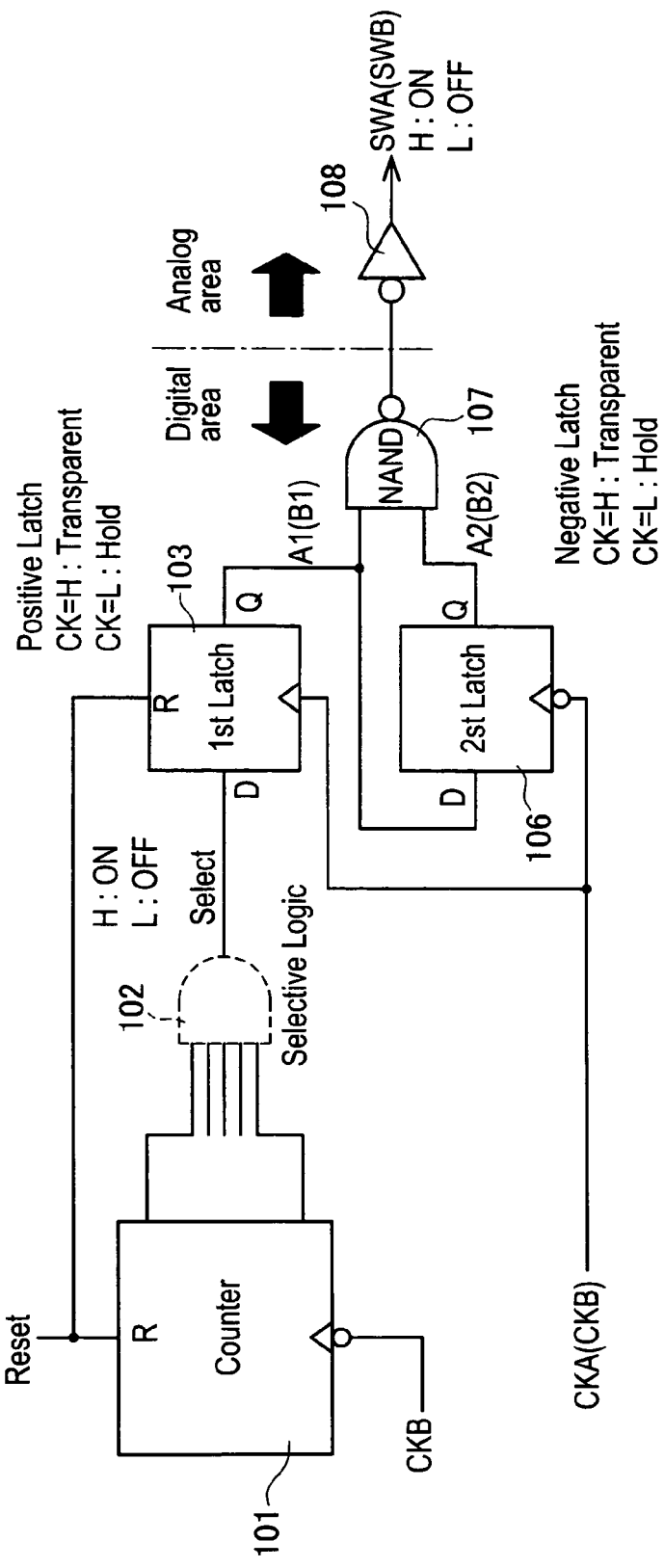
FIG. 39 is a block diagram showing the switch control logic in the case of using no delayed clock.
Figure 40:
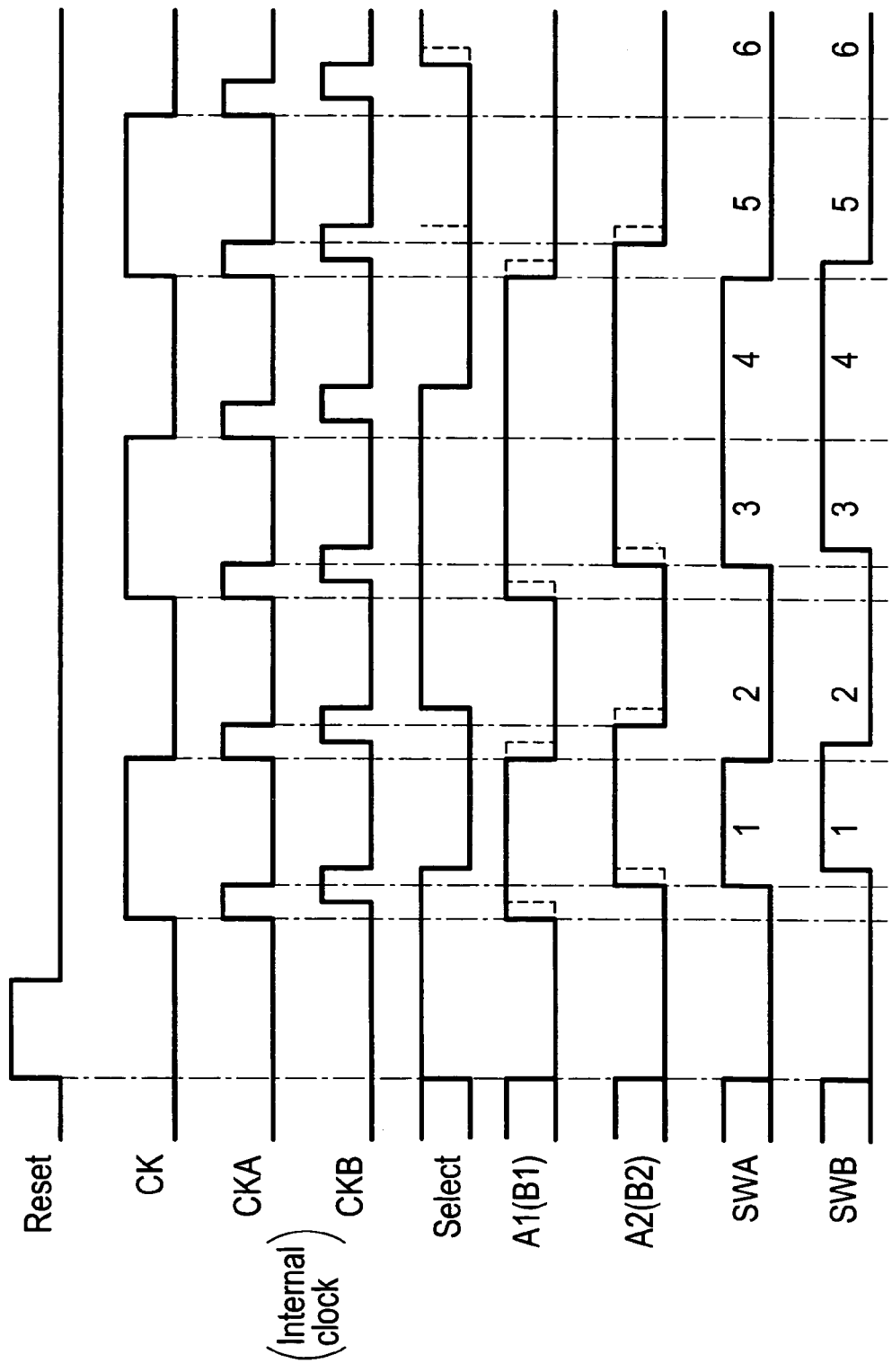
FIG. 40 is a timing chart for explaining the switch control in the block diagram of FIG. 39.

In the switch control according to this embodiment, a configuration using no delayed clock signal CKd is enabled. A block diagram in that case is shown in FIG. 39, and a timing chart in that case is shown in FIG. 40. In the case of the block structure, the delayed clock signal CKd is replaced with internal clock signals CKA and CKB. The internal clock signal CKA is an exclusive OR of the clock signal CK and a signal by allowing the clock signal to pass through the delay logic. The internal clock signal CKB is a signal resulting from delaying the internal clock signal CKA. The amount of delay of the internal clock signal CKB with respect to the internal clock signal CKA is smaller than the pulse width of the internal clock signal CKA.

In the block structure shown in FIG. 39, the following things are different from FIG. 37. First, a clock used in the counter 101 is the internal clock signal CKB. Also, the second latch 104 that is a positive latch is replaced with a second latch 106 that is a negative latch. In other words, the second latch 106 allows the signal of the input terminal D to pass through to the output terminal Q at the falling edge of the clock signal. In other cases, there is no change in the state of the output terminal Q. Also, both of the first latch 103 and the second latch 106 receive the same internal clock signal CKA (or CKB). Then, the AND gate 105 is replaced by the NAND gate 107. In addition, an inverter 108 is disposed at the output of the NAND gate 107.

FIG. 40 is a timing chart in the case where the corresponding switch is on at a clock 1, off at a clock 2, on at clocks 3 and 4, and off at clocks 5 and 6, as in FIG. 38. In this case, the clock is an internal clock signal CKA (or CKB).

In this case, the selecting signal becomes high with the rising of the reset signal, low at the falling of the internal clock CKB1, high at the falling of the internal clock CKB2, and low at the falling of the internal clock CKB4.

As a result, the output signal A1 of the first latch 103 becomes high at the rising of the internal clock CKA1 (the selecting signal is high at this time), low at the rising of the internal clock CKA2 (the selecting signal is low at this time), high at the rising of the internal clock CKA3 (the selecting signal is high at this time), and low at the rising of the internal clock CKA5 (the selecting signal is low at this time).

Then, the output signal A2 of the second latch 106 becomes high at the falling of the internal clock CKA1 (the output signal A1 is high at this time), low at the falling of the internal clock CKA2 (the output signal A1 is low at this time), high at the falling of the internal clock CKA3 (the output signal A1 is high at this time), and low at the falling of the internal clock CKA5 (the output signal A1 is low at this time).

As a result, the output signal of the inverter 108, that is, the operation signal SWA of the switch becomes high at the falling of the internal clock CKA1, low at the rising of the internal clock CKA2, high at the falling of the internal clock CKA3, and low at the rising of the internal clock CKA5.

In this manner, the switch control as in the case of FIG. 38 that removes the malfunction due to both of those switches being on and the temporary off state is realized without the delayed clock CKd. In the above structure, when the first latch 103 and the second latch 106 depend on the internal clock signal CKB, those latches are capable of outputting the operation signal SWB that is slightly delayed from the operation signal SWA. Dotted lines at columns A1 and A2 in FIG. 40 indicate output signals B1 and B2 of the first latch 103 and the second latch 106 in that case.

[Application]

Figure 41:
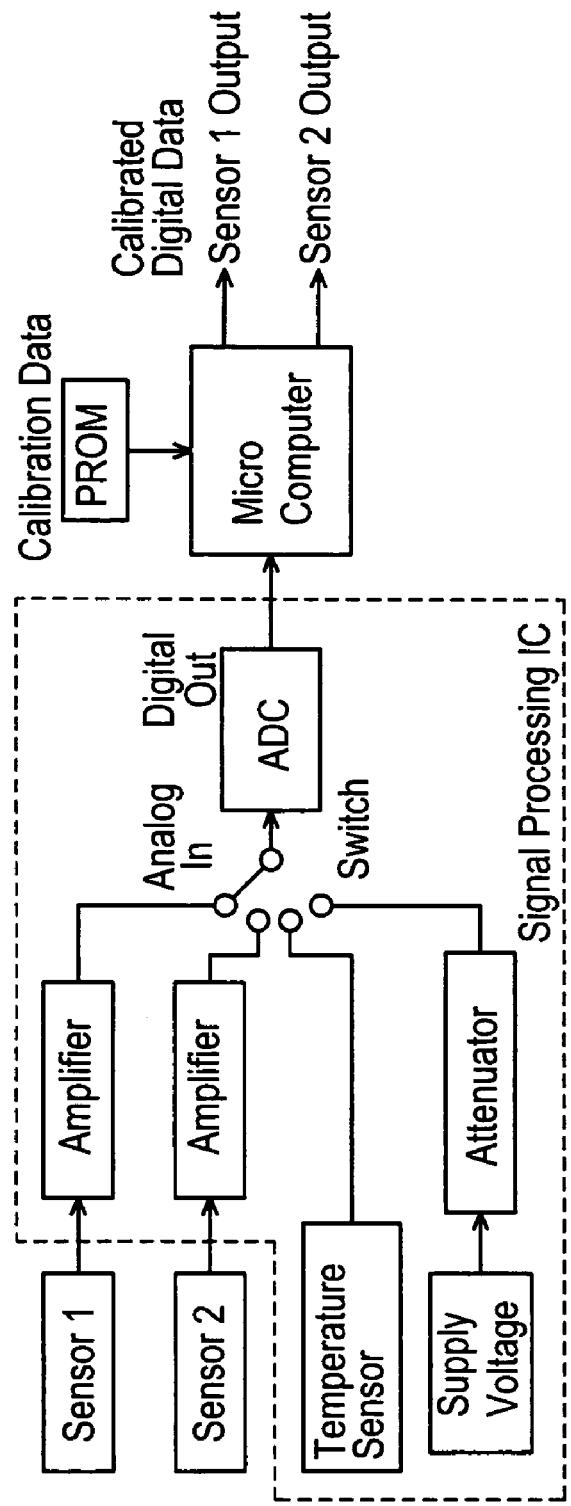
FIG. 41 is a block diagram showing a calibration system of a sensor value using the A/D converter according to the embodiment.

The A/D converter according to this embodiment can be realized by being assembled into a signal processing IC as shown in FIG. 41. "ADC" in FIG. 41 is an A/D converter according to this embodiment. FIG. 41 shows a calibration system of a sensor, including a signal processing IC with the A/D converter of this embodiment and a microcomputer. The ADC of this embodiment is selectively inputted with an analog signal from a large number of sensors inside and outside of the IC, digitally converts the input, and then delivers the digital value to the microcomputer. The microcomputer executes various trimming operation to the digital value, and controls various actuators from the trimmed digital value.

For example, in the case of using the A/D converter for automobiles, a precision of about 10 to 12 bits is required after trimming with regard to the sensor characteristics (zero point, sensitivity, those temperature characteristic, supply voltage characteristic, etc.). On the other hand, there is a variation in the sensor characteristics itself. For trimming with regard to the sensor characteristics in the digital operation, a precision of 12 to 14 bits is required for the A/D converter. In the conventional A/D converter, it is difficult to realize both the above high precision and plural inputs. In the structure of FIG. 41, plural analog signals can be processed by one A/D converter by changing over input switches. Also, a large-scale digital decimation filter is not required, and the post digital process by the microcomputer can be relaxed. For that reason, a high performance microcomputer is not required.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

In the present invention, it is desirable to conduct the digital conversion by the calculation Nyquist-rate A/D conversion of the LSBs. Also, it is desirable that at least one output voltage of the plural $\Sigma\Delta$ modulators is compared with a given voltage, and the operation point of the integrator in the $\Sigma\Delta$ modulator is shifted according to the comparison result. In this situation, it is desirable to reverse the polarity of the operation point by shifting.

In the present invention, preferably, threshold values of the quantization in the plurality of the $\Sigma\Delta$ modulators are dispersed over a range of a predetermined value or more toward positive and negative of a reference value as the center. Preferably, the predetermined value of the threshold value dispersion range is $\frac{1}{32}$ or more of a reference voltage, e.g. supply voltage. Further preferably, the sampling capacitor in each of the $\Sigma\Delta$ modulators is divided into at least two, and the A/D converter further comprises a mismatch cancellation unit that conducts mismatch cancellation by arithmetic operation using at least one of five values of the total capacitances of the sampling capacitors, the divided capacitance of the sampling capacitors, and 0 in the parallel oversampling process, especially in the residue adding process.

Also, in the present invention, it is desirable to conduct transfer back of the residue value of the integrator in the first $\Sigma\Delta$ modulator to the sampling capacitor in the first $\Sigma\Delta$ modulator, and transfer sampling of the residue value that has been transferred back to the sampling capacitor in the first $\Sigma\Delta$ modulator to the sampling capacitor in the second $\Sigma\Delta$ modulator, in the addition process of the residue values. In addition, it is desirable that the integrator in each of the $\Sigma\Delta$ modulators is made up of an integration capacitor and an amplifier, and the transfer sampling is conducted in a state where the sampling capacitor and the integration capacitor in the first $\Sigma\Delta$ modulator are separated.

In this case, more preferably, the residue adding unit comprises: a first offset adder that conducts addition or subtraction of a predetermined value to the sampling capacitor of the first $\Sigma\Delta$ modulator prior to transferring back; and a second offset adder that conducts addition or subtraction of a predetermined value reverse in polarity to that of the first offset adder to the sampling capacitor of the first $\Sigma\Delta$ modulator before transfer sampling after transferring back. Further preferably, the sampling capacitor of the $\Sigma\Delta$ modulator is divided into at least two, and the first and second offset adders perform addition or subtraction of the reference voltage to a part of the divided sampling capacitors.

Further, preferably, the A/D converter further comprises: a first switch that is disposed in a connection path between the output side of the integrator of the first $\Sigma\Delta$ modulator and the input side of the sampling capacitor of the second $\Sigma\Delta$ modulator; and a second switch that is disposed in a connection path between the output side of the integrator of the second $\Sigma\Delta$ modulator and the input side of the sampling capacitor of the first $\Sigma\Delta$ modulator, wherein the sampling capacitor in each of the $\Sigma\Delta$ modulators is divided into at least two, and wherein the LSBs calculating unit obtains the LSBs by repeating a first step of conducting multiply-by-two operation on the residue value by using the divided sampling capacitors of the first $\Sigma\Delta$ modulator, and sampling the doubled residue value by the sampling capacitor of the second $\Sigma\Delta$ modulator through the first switch, and a second step of conducting multiply-by-two operation on the residue value by using the divided sampling capacitors of the second $\Sigma\Delta$ modulator, and sampling the doubled residue value by the sampling capacitor of the first $\Sigma\Delta$ modulator through the second switch.

In this case, preferably, the A/D converter further comprises a voltage detector that detects at least one output voltage of the plurality of $\Sigma\Delta$ modulators, wherein the LSBs calculating unit uses a $\Sigma\Delta$ modulator in which the output voltage is detected by the voltage detector as the first $\Sigma\Delta$ modulator in a first step, conducts addition or subtraction of a reference value to one of the divided sampling capacitors in the case where an absolute value of the output voltage is in a range between $\frac{1}{4}$ and $\frac{1}{2}$ of reference voltage, transfers the residue value to the sampling capacitor from the integrator, and conducts transferring back to the integrator by the divided sampling capacitors that conducted addition or subtraction.

In the present invention, preferably, the control unit comprises: a switch selecting unit that outputs a selecting signal for each of the switches; a first latch circuit that follows a reference clock and receives input of the selecting signal; a second latch circuit that follows a delayed clock resulting from delaying the reference clock by a predetermined time and receives input of the output signal of the first latch circuit or the selecting signal; and a logic circuit that produces a switch operation signal by the logic operation of the output signals of the first and second latch circuits. Alternatively, when the first and second latch circuits are reverse in polarity, the second latch circuit may follow the reference clock.

What is claimed is:

1. An A/D converter, comprising:
a plurality of sigma-delta modulators which are connected to each other in parallel, and each of which has an integrator, and a quantizer; and
a control unit that controls the plurality of sigma-delta modulators;
wherein the control unit comprises:
a parallel oversampling control unit that makes each of the sigma-delta modulators conduct sampling of an analog input signal and quantize a sampling result by the integrator and the quantizer;
an MSBs calculating unit that adds quantized values in the respective sigma-delta modulators to obtain the MSBs;
a residue adding unit that adds residue values of the integrators after quantization in the respective sigma-delta modulators; and
an LSBs calculating unit that converts the addition result of the residue adding unit into a digital value to obtain LSBs.

2. The A/D converter according to claim 1,
wherein the LSBs calculating unit conducts digital conversion by Nyquist-rate A/D conversion.

3. The A/D converter according to claim 1, further comprising:
a voltage comparator that compares at least one output voltage of the plurality of sigma-delta modulators with a predetermined voltage; and
an integration operation point shifting unit that shifts the operation point of the integrator in the sigma-delta modulator according to the comparison result of the voltage comparator.

4. The A/D converter according to claim 3,
wherein the integration operation point shifting unit reverses the polarity of the operation point due to shifting.

5. The A/D converter according to claim 1,
wherein threshold values of the quantization in the plurality of sigma-delta modulators are dispersed toward positive and negative.

6. The A/D converter according to claim 5,
wherein the range of the threshold value dispersion is $\frac{1}{32}$ or more of a reference voltage.

7. The A/D converter according to claim 1,
wherein a sampling capacitor in each of the sigma-delta modulators is divided into at least two, and
further comprising a mismatch cancellation unit that conducts mismatch cancellation by arithmetic operation using at least one of five values of the ±total capacitances of the sampling capacitors, the ± divided capacitance of the sampling capacitors, and in the residue adding process.

8. The A/D converter according to claim 1, wherein the residue adding unit comprises
a transfer back unit that transfers back the residue value of the integrator in a first sigma-delta modulator to a sampling capacitor of the first sigma-delta modulator; and
a transfer sampling unit that samples a residue value that is transferred back to the sampling capacitor of the first sigma-delta modulator to the sampling capacitor of a second sigma-delta modulator.

9. The A/D converter according to claim 8,
wherein the integrator in each of the sigma-delta modulators includes an integration capacitor and an amplifier, and
further comprising a separating unit that separates a sampling capacitor and the integration capacitor of the first sigma-delta modulator when conducting sampling by the transfer sampling unit.

10. The A/D converter according to claim 8, wherein the residue adding unit performs:
a first offset adding process that conducts addition or subtraction of a predetermined value to the sampling capacitor of the first sigma-delta modulator prior to transferring back; and
a second offset adding process that conducts addition or subtraction of a predetermined value reverse in polarity to that of the first offset adding process to the sampling capacitor of the first sigma-delta modulator before transfer sampling after transferring back.

11. The A/D converter according to claim 10,
wherein the sampling capacitor of the sigma-delta modulator is divided into at least two, and
wherein the first and second offset adding processes comprise addition or subtraction of the reference voltage to a part of the divided sampling capacitors.

12. The A/D converter according to claim 1,
further comprising: a first switch that is disposed in a connection path between an output side of the integrator of the first sigma-delta modulator and an input side of a sampling capacitor of the second sigma-delta modulator; and
a second switch that is disposed in a connection path between an output side of the integrator of the second sigma-delta modulator and an input side of the sampling capacitor of the first sigma-delta modulator,
wherein the sampling capacitor in each of the sigma-delta modulators is divided into at least two, and
wherein the LSBs calculating unit obtains the LSBs by repeating a first step of conducting multiply-by-two operation on the residue value by using the divided sampling capacitors of the first sigma-delta modulator, and sampling the doubled residue value by the sampling capacitor of the second sigma-delta modulator through the first switch, and
a second step of conducting multiply-by-two operation on the residue value by using the divided sampling capacitors of the second sigma-delta modulator, and sampling the doubled residue value by the sampling capacitor of the first sigma-delta modulator through the second switch.

13. The A/D converter according to claim 12,
further comprising a voltage detector that detects at least one output voltage of the plurality of sigma-delta modulators,
wherein the LSBs calculating unit uses a sigma-delta modulator in which the output voltage is detected by the voltage detector as the first sigma-delta modulator in a initial step,
conducts addition or subtraction of a reference value to one of the divided sampling capacitors in the case where an absolute value of the output voltage is in a range between $\frac{1}{4}$ and $\frac{1}{2}$ of reference voltage,
transfers the residue value to the sampling capacitor from the integrator, and conducts transferring back to the integrator by the divided sampling capacitors that conducted addition or subtraction.

14. The A/D converter according to claim 1, wherein the control unit comprises:
- a switch selecting unit that outputs a selecting signal for each of the switches;
- a first latch circuit that follows a reference clock and receives input of the selecting signal;
- a second latch circuit that follows a delayed clock resulting from delaying the reference clock by a predetermined time and receives input of the output signal of the first latch circuit or the selecting signal; and
- a logic circuit that produces a switch operation signal by the logic operation of the output signals of the first and second latch circuits.

15. The A/D converter according to claim 1, wherein the control unit comprises:
- a switch selecting unit that outputs a selecting signal for each of the switches;
- a first latch circuit that follows a clock and receives input of the selecting signal;
- a second latch circuit that follows a clock and receives input of the output signal of the first latch circuit or the selecting signal; and
- a logic circuit that produces a switch operation signal by the logic operation of the output signals of the first and second latch circuits,
- wherein the first and second latch circuits are reverse in polarity.

16. An A/D conversion method using a plurality of sigma-delta modulators which are connected to each other in parallel, and each of which has a sampling capacitor, an integrator, and a quantizer, the method comprising:
- a parallel oversampling process of making each of the sigma-delta modulators conduct sampling of an analog input signal by the sampling capacitor and quantize a sampling result by the integrator and the quantizer;
- an MSBs calculating process to obtain MSBs by adding quantized values in the parallel oversampling process in the respective sigma-delta modulators;
- a residue adding process of adding residue values of the integrators in the respective sigma-delta modulators after the parallel oversampling process; and
- an LSBs calculating process of digitally converting the addition result of the residual adding process to obtain LSBs.

17. The A/D conversion method according to claim 16, wherein digital conversion by Nyquist-rate A/D conversion is conducted in the LSBs calculating process.

18. The A/D conversion method according to claim 16, further comprising a integration operation point shifting process of comparing at least one output voltage of the plurality of sigma-delta modulators with a predetermined voltage, and shifting the operation point of the integrator in the sigma-delta modulator according to the comparison result.

19. The A/D conversion method according to claim 18, wherein the polarity of the operation point is reversed in the integration operation point shifting process due to shifting.

20. The A/D conversion method according to claim 16, wherein threshold values of the quantization in the plurality of sigma-delta modulators are dispersed toward positive and negative.

21. The A/D conversion method according to claim 20, wherein the range of the predetermined value dispersion is $\frac{1}{32}$ or more of a reference voltage.

22. The A/D conversion method according to claim 16,
- wherein the sampling capacitor in each of the sigma-delta modulators is divided into at least two, and
- wherein in the residue adding process, mismatch cancellation is conducted by arithmetic operation using at least one of five values of the ±total capacitances of the sampling capacitors, the ± divided capacitance of the sampling capacitors, and 0.

23. The A/D conversion method according to claim 16, wherein in the residue adding process comprising:
- transferring back of the residue value of the integrator in a first sigma-delta modulator to the sampling capacitor of the first sigma-delta modulator, and
- transfer sampling of a residue value that is transferred back to the sampling capacitor of the first sigma-delta modulator to the sampling capacitor of a second sigma-delta modulator.

24. The A/D conversion method according to claim 23,
- wherein the integrator in each of the sigma-delta modulators includes an integration capacitor and an amplifier, and
- wherein the transfer sampling is conducted in a state that the sampling capacitor and the integration capacitor of the first sigma-delta modulator are separated.

25. The A/D conversion method according to claim 23, wherein the residue adding process comprising:
- a first offset adding process that conducts addition or subtraction of a predetermined value to the sampling capacitor of the first sigma-delta modulator prior to transferring back, and
- a second offset adding process that conducts addition or subtraction of a predetermined value reverse in polarity to that of the first offset adding process to the sampling capacitor of the first sigma-delta modulator before transfer sampling after transferring hack.

26. The A/D conversion method according to claim 25,
- wherein the sampling capacitor of the sigma-delta modulator is divided into at least two, and
- wherein the first and second offset adding processes comprise addition or subtraction of the reference voltage to a part of the divided sampling capacitors.

27. The A/D conversion method according to claim 16,
- using a first switch that is disposed in a connection path between an output side of the integrator of the first sigma-delta modulator and an input side of the sampling capacitor of the second sigma-delta modulator;
- using a second switch that is disposed in a connection path between an output side of the integrator of the second sigma-delta modulator and an input side of the sampling capacitor of the first sigma-delta modulator; and
- using the sampling capacitor in each of the sigma-delta modulators being divided into at least two,
- wherein in the LSBs calculating process the LSBs is obtained by repeating a first step of conducting multiply-by-two operation on the residue value by using the divided sampling capacitors of the first sigma-delta modulator, and sampling the doubled residue value by the sampling capacitor of the second sigma-delta modulator through the first switch, and
- a second step of conducting multiply-by-two operation on the residue value by using the divided sampling capacitors of the second sigma-delta modulator, and sampling the doubled residue value by the sampling capacitor of the first sigma-delta modulator through the second switch.

28. The A/D conversion method according to claim 27, further using a voltage detecting process to detect at least one output voltage of the plurality of sigma-delta modulators, and wherein in the LSBs calculating process a sigma-delta modulator in which the output voltage is detected by the voltage detector is used as the first sigma-delta modulator in a initial step, addition or subtraction of a reference value to one of the divided sampling capacitors is conducted in the case where an absolute value of the output voltage is in a range between ¼ and ½ of reference voltage, the residue value is transferred to the sampling capacitor from the integrator, and transferring back to the integrator is conducted by the divided sampling capacitors that conducted addition or subtraction.

29. The A/D conversion method according to claim 16, inputting a selecting signal for each of the switches within the plurality of sigma-delta modulators to a first latch circuit that follows a reference clock, inputting the output signal of the first latch circuit or the selecting signal to a second latch circuit that follows a delayed clock resulting from delaying the reference clock by a predetermined time, producing a switch operation signal by the logic operation of the output signals of the first and second latch circuits, and operating the switches according to the switch operation signal.

30. The A/D conversion method according to claim 16, inputting a selecting signal for each of the switches within the plurality of sigma-delta modulators to a first latch circuit that follows a clock, inputting the output signal of the first latch circuit or the selecting signal to a second latch circuit that is reverse in the polarity to the first latch circuit and that follows the clock, producing a switch operation signal by the logic operation of the output signals of the first and second latch circuits, and operating the switches according to the switch operation signal.

* * * * *

UNITED STATES PATENT AND TRADEMARK OFFICE
CERTIFICATE OF CORRECTION

PATENT NO. : 7,289,054 B1　　　　　　　　　　　　　　　　　　　　　　　Page 1 of 1
APPLICATION NO. : 11/451505
DATED : October 30, 2007
INVENTOR(S) : Hikaru Watanabe It is certified that error appears in the above-identified patent and that said Letters Patent is hereby corrected as shown below:

| Column | Line | |
|---|---|---|
| 9 | 6 | After "time t0" insert --to--. |
| 25 | 66 | Change "total" to --±total--. |
| 25 | 67 | Change "the divided" to --the ±divided--. |

Signed and Sealed this

Twenty-fourth Day of June, 2008

JON W. DUDAS
*Director of the United States Patent and Trademark Office*